United States Patent
Yaoi et al.

(10) Patent No.: US 7,372,758 B2
(45) Date of Patent: May 13, 2008

(54) SEMICONDUCTOR MEMORY DEVICE, METHOD FOR CONTROLLING THE SAME, AND MOBILE ELECTRONIC DEVICE

(75) Inventors: Yoshifumi Yaoi, Yamatokooriyama (JP); Hiroshi Iwata, Nara (JP); Akihide Shibata, Nara (JP); Kei Tokui, Chiba (JP); Masaru Nawaki, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 21 days.

(21) Appl. No.: 10/529,880

(22) PCT Filed: Oct. 2, 2003

(86) PCT No.: PCT/JP03/12663

§ 371 (c)(1),
(2), (4) Date: Nov. 17, 2005

(87) PCT Pub. No.: WO2004/032148

PCT Pub. Date: Apr. 15, 2004

(65) Prior Publication Data

US 2006/0244049 A1    Nov. 2, 2006

(30) Foreign Application Priority Data

Oct. 4, 2002  (JP) ............................ 2002-292105
May 20, 2003 (JP) ............................ 2003-142157

(51) Int. Cl.
*G11C 7/00* (2006.01)

(52) U.S. Cl. .................................. 365/226; 365/189.07

(58) Field of Classification Search ................ 365/226, 365/189.07
See application file for complete search history.

(56) References Cited

U.S. PATENT DOCUMENTS

| | | | | |
|---|---|---|---|---|
| 4,882,707 A | * | 11/1989 | Mizutani | 365/185.12 |
| 4,933,907 A | * | 6/1990 | Kumanoya et al. | 365/222 |
| 5,623,677 A | * | 4/1997 | Townsley et al. | 713/310 |

(Continued)

FOREIGN PATENT DOCUMENTS

JP    62-145598 A    6/1987

(Continued)

*Primary Examiner*—Michael T Tran
(74) *Attorney, Agent, or Firm*—Birch, Stewart, Kolasch & Birch, LLP

(57) ABSTRACT

A memory cell array employs a memory element as a memory cell. The memory element is constructed of a gate electrode formed via a gate insulation film on a semiconductor layer, a channel region arranged under the gate electrode, diffusion regions that are arranged on both sides of the channel region and have a conductive type opposite to that of the channel region, and memory function bodies that are arranged on both sides of the gate electrode and have a function to retain electric charges. When first and second power voltages VCC1 and VCC2 supplied from the outside are lower than a prescribed voltage, a rewrite command to a memory circuit 34 that includes the memory cell array is inhibited by a lockout circuit 33*a*. With this arrangement, there are provided a semiconductor storage device capable of achieving storage retainment of two bits or more per memory element and stable operation even if the device is miniaturized and preventing the occurrence of a malfunction of rewrite error and so on attributed to a reduction in the power voltage supplied from the outside and a control method therefor.

27 Claims, 19 Drawing Sheets

U.S. PATENT DOCUMENTS

| | | | |
|---|---|---|---|
| 5,896,338 A | 4/1999 | Landgraf et al. | |
| 5,931,951 A * | 8/1999 | Ando | 713/324 |
| 5,963,467 A * | 10/1999 | Miyatake et al. | 365/149 |
| 5,974,551 A * | 10/1999 | Lee | 713/300 |
| 6,335,554 B1 | 1/2002 | Yoshikawa | |
| 6,343,044 B1 * | 1/2002 | Hsu et al. | 365/227 |
| 6,683,491 B2 * | 1/2004 | Koga et al. | 327/544 |
| 6,775,784 B1 * | 8/2004 | Park | 713/320 |
| 2002/0105037 A1 | 8/2002 | Takahashi | |

FOREIGN PATENT DOCUMENTS

| | | |
|---|---|---|
| JP | 5-109291 A | 4/1993 |
| JP | 5-258584 A | 10/1993 |
| JP | 5-304277 A | 11/1993 |
| JP | 6-65919 U | 9/1994 |
| JP | 9-503880 A | 4/1997 |
| JP | 10-293998 A | 11/1998 |
| JP | 11-501761 A | 2/1999 |
| JP | 2000-331479 A | 11/2000 |
| JP | 2001-156188 A | 6/2001 |
| JP | 2002-50703 A | 2/2002 |
| JP | 2002-237540 A | 8/2002 |
| WO | WO-95/09483 A1 | 4/1995 |
| WO | WO-97/49085 A1 | 12/1997 |

* cited by examiner

SEMICONDUCTOR MEMORY DEVICE, METHOD FOR CONTROLLING THE SAME, AND MOBILE ELECTRONIC DEVICE This application is the US national phase of International Application PCT/JP2003/012663 filed Oct. 2, 2003, which designated the US. PCT/JP2003/012663 claims priority to JP Patent Applications No. 2002-292105 filed Oct. 4, 2002 and No. 2003-142157 filed May 20, 2003. The entire contents of these applications are incorporated herein by reference.

TECHNICAL FIELD

The present invention relates to a semiconductor storage device, a control method therefor and portable electronic equipment, and in particular, to a semiconductor storage device provided with a memory cell array in which field-effect transistors having a memory function are used as memory cells, a method for controlling the semiconductor storage device and portable electronic equipment that employs the semiconductor storage device.

BACKGROUND ART

Conventionally, a flash memory has typically been used as a nonvolatile semiconductor storage device.

In this flash memory, as shown in FIG. 28, a floating gate 902, an insulation film 907 and a word line (control gate) 903 are formed in this order via a gate insulation film 908 on a semiconductor substrate 901, and a source line 904 and a bit line 905 respectively constructed of diffusion regions are formed on both sides of the floating gate 902, constituting a memory cell. Around this memory cell are formed element isolation regions 906 (refer to Japanese Patent Laid-Open Publication No. HEI 5-304277).

The memory cell retains storage as the quantity of charge in the floating gate 902. In the memory cell array constructed by arranging the memory cells, the desired memory cell can be subjected to rewrite and read operations by selecting the specified word line and bit line and applying a prescribed voltage to the lines.

The flash memory as described above exhibits a drain current Id to gate voltage Vg characteristic indicated by the solid line curve and the dashed line curve in FIG. 29 when the quantity of charges in the floating gate 902 changes. That is, if the quantity of negative charges in the floating gate 902 is increased, then the characteristic curve changes from the characteristic indicated by the solid line curve to the characteristic indicated by the dashed line curve in FIG. 29, and the Id-Vg curve is displaced roughly parallel in a direction in which the gate voltage Vg increases with respect to same drain current Id with an increase in the threshold voltage.

However, the flash memory as described above has been functionally required to arrange the insulation film 907 that isolates the floating gate 902 from the word line 903 and had difficulties in reducing the thickness of the gate insulation film to prevent the leak of charges from the floating gate 902. Therefore, it has been difficult to effectively reduce the thickness of the insulation film 907 and the gate insulation film, and this has hindered the miniaturization of the memory cell.

Therefore, the semiconductor storage device provided with the memory cell array that employs the aforementioned memory elements as memory cells has the problem that reliable operation cannot be achieved with a further reduced circuit area.

Moreover, the semiconductor storage device that employs the aforementioned memory elements as memory cells in the memory cell array has a problem that a malfunction of rewrite error and so on occurs when the level of the power voltage supplied to the memory circuit including the memory cell array is lowered during the rewrite operation. In this case, the term of "rewrite" means operation that includes at least write or erase.

Moreover, it is required to reduce power consumption in a standby stage in order to increase the operating time on a battery in the portable electronic equipment that employs the memory circuit including the memory cell array. In particular, the memory circuit has had an increasing occupation ratio in recent years in integrated circuits and so on for the purpose of executing real-time processing of motion pictures, and it has been a major problem to reduce the leak current of the memory circuit in the standby state for the long-time operation on the battery.

DISCLOSURE OF THE INVENTION

Accordingly, an object of the present invention is to provide a semiconductor storage device capable of achieving storage retainment of two bits or more per memory element and stable operation even if the device is miniaturized and preventing the occurrence of a malfunction of rewrite error and so on attributed to a reduction in the power voltage supplied from the outside.

Another object of the present invention is to provide a semiconductor storage device capable of largely reducing the leak current in the standby stage.

Yet another object of the present invention is to provide portable electronic equipment capable of being downsized, improved in performance and reduced in power consumption with the above-mentioned semiconductor storage device employed.

In order to achieve the aforementioned object, the present invention provides a semiconductor storage device comprising:

a memory cell array employing a memory element as a memory cell wherein the memory element is constructed of a gate electrode formed via a gate insulation film on a semiconductor layer, a channel region arranged under the gate electrode, diffusion regions that are arranged on both sides of the channel region and have a conductive type opposite to that of the channel region and memory function bodies that are formed on both sides of the gate electrode and have a function to retain electric charges; and a lockout circuit that inhibits a command to a memory circuit including the memory cell array when a power voltage supplied from outside is lower than a prescribed voltage.

According to the semiconductor storage device of the above-mentioned construction, by employing the memory element as the memory cell for the memory cell array, storage retention of two bits or more per memory element and stable operation can be achieved even if the device is miniaturized. Moreover, when the power voltage supplied from the outside is lower than the prescribed voltage, the command to the memory circuit including the memory cell array is inhibited by the lockout circuit. Therefore, the occurrence of the malfunction of rewrite error and so on attributed to a reduction in the level of the power voltage supplied to the memory circuit including the memory cell array can be prevented.

Moreover, in one embodiment, the power voltage supplied from the outside is comprised of at least a first power voltage supplied to the memory circuit including the memory cell array and a second power voltage supplied to an output circuit, and the lockout circuit comprises:

a voltage detector that outputs a first lockout signal for inhibiting the command to the memory circuit including the memory cell array when the first power voltage is not higher than a first prescribed voltage; and a power voltage confirmation circuit that outputs a second lockout signal for inhibiting the command to the memory circuit including the memory cell array when the second power voltage is lower than a second prescribed voltage.

According to the semiconductor storage device of the above-mentioned embodiment, the occurrence of the malfunction of rewrite error and so on attributed to the reduction in the level of the power voltage supplied to the memory circuit including the memory cell array can be prevented by the voltage detector. Furthermore, the occurrence of the malfunction attributed to the reduction in the level of the supplied power voltage can be prevented by the power voltage confirmation circuit also with regard to the output circuit that connects the memory circuit including the memory cell array to the outside.

Moreover, in one embodiment, the power voltage confirmation circuit outputs a lockout signal for inhibiting the command to the memory circuit including the memory cell array when the first power voltage is lower than the first prescribed voltage.

According to the semiconductor storage device of the above-mentioned embodiment, by sending the signal from the voltage detector to the power voltage confirmation circuit and outputting the lockout signal from the power voltage confirmation circuit when the first power voltage is lower than the first prescribed voltage, the occurrence of the circuit malfunction can be prevented to allow the desired operation to be reliably executed.

Moreover, the semiconductor storage device of one embodiment comprises a comparator that compares the second power voltage with the second prescribed voltage and outputs a signal representing the fact that the second power voltage is higher than the second prescribed voltage to the power voltage confirmation circuit when the second power voltage is higher than the second prescribed voltage.

According to the semiconductor storage device of the above-mentioned embodiment, the comparator being a circuit of a small area can compare the power voltage supplied to the input/output buffer circuit with the second prescribed voltage with high accuracy, allowing this semiconductor storage device to be accurately operated with a smaller circuit area.

Moreover, in one embodiment, the voltage detector outputs a signal representing the fact that the first power voltage is lower than the first prescribed voltage to the power voltage confirmation circuit when the first power voltage is lower than the first prescribed voltage.

According to the semiconductor storage device of the above-mentioned embodiment, by giving the signal representing the fact that the first power voltage is lower than the first prescribed voltage from the voltage detector to the power voltage confirmation circuit when the first power voltage is lower than the first prescribed voltage, the voltage level in the power voltage confirmation circuit can be rapidly detected, so that the occurrence of a malfunction due to the delay of the voltage level detection can be prevented.

Moreover, in one embodiment, the power voltage confirmation circuit confirms the second power voltage upon receiving a signal representing the fact that the command is given to the memory circuit including the memory cell array.

According to the semiconductor storage device of the above-mentioned embodiment, in the case where the power to the memory circuit including the memory cell array is turned on, a voltage higher than the predetermined voltage is maintained, thereafter an idling state is established without verifying the voltage level and subsequently the command is given again to the memory circuit including the memory cell array, the signal representing the fact that the command is given to the memory circuit including the memory cell array is outputted to the power voltage confirmation circuit, and the power voltage confirmation circuit, which receives the signal, enters an active state in which the level of the supplied power voltage is confirmed. Therefore, it is possible to verify whether or not the level of the power voltage has a proper value when the command is given to the memory circuit in the active state after the power supply of this semiconductor storage device is turned on.

Moreover, in one embodiment, the power voltage confirmation circuit outputs a signal representing a result of the confirmation of the second power voltage according to the signal representing the fact that the command is given to the memory circuit including the memory cell array.

According to the semiconductor storage device of the above-mentioned embodiment, the command to the memory circuit including the memory cell array can be inhibited when the level of the supplied power voltage does not have the proper value in the active state after the power supply is turned on.

Moreover, in one embodiment, the second prescribed voltage is within a range of 0.3 V to 1.2 V.

According to the semiconductor storage device of the above-mentioned embodiment, by setting the second prescribed voltage within the range of 0.3 V to 1.2 V, the voltage at the proper level can be supplied from the power supply according to the size of the transistor even if the power voltage is lowered in accordance with the progress of the fine processing technology, and this allows a semiconductor storage device of less malfunctions to be provided.

Moreover, in one embodiment, the command to the memory circuit including the memory cell array is inhibited when at least one of the first lockout signal from the voltage detector and the second lockout signal from the power voltage confirmation circuit is outputted.

According to the semiconductor storage device of the above-mentioned embodiment, the command to the memory circuit including the memory cell array can be inhibited by at least one of the first lockout signal from the voltage detector representing the fact that the first power voltage is lower than the first prescribed voltage or the second lockout signal from the power voltage confirmation circuit representing the fact that the second power voltage is lower than the second prescribed voltage. Consequently, the occurrence of the malfunction of rewrite error and so on caused by the reduction in the level of either the first power voltage supplied to the memory circuit including the memory cell array or the second power voltage supplied to the output circuit can also be prevented.

Moreover, in one embodiment, a supply state of the power voltage of the voltage detector is controlled by the first power voltage.

According to the semiconductor storage device of the above-mentioned embodiment, with regard to the supply state of the power voltage of the voltage detector, the voltage detector can be put into an OFF state for the sake of power consumption reduction by being controlled by the first power voltage when, for example, the state of the first power voltage becomes equal to or higher than the prescribed voltage and the voltage detector becomes unnecessary.

Moreover, in one embodiment, a voltage generator circuit for generating the second prescribed voltage is provided, and the supply state of the power voltages of the comparator and the voltage generator circuit are controlled by the second power voltage.

According to the semiconductor storage device of the above-mentioned embodiment, with regard to the supply states of the power voltages of the comparator and the voltage generator circuit, these units can be put into the OFF state for the sake of power consumption reduction by being controlled by the second power voltage when, for example, the second power voltage becomes equal to or higher than the prescribed voltage and the comparator and the voltage generator circuit become unnecessary.

Moreover, the semiconductor storage device of one embodiment comprises power supply switches that are turned on when the memory circuit including the memory cell array is in an active state to supply the power voltage to at least the memory circuit including the memory cell array and turned off when the memory circuit is in a standby state to stop the supply of the power voltage to at least the memory circuit including the memory cell array.

According to the semiconductor storage device of the above-mentioned embodiment, by turning off the power supply switch when the memory circuit is in the standby state, the power consumption attributed to the leak current in the standby stage can be reduced. Furthermore, by inhibiting the command to the memory circuit when the power supply switch is in the OFF state and the supply of the power voltage to the semiconductor storage device is stopped, the occurrence of the malfunction can more reliably be prevented. For example, it is possible prevent the occurrence of a malfunction due to the stop of the supply of the power voltage when the command is sent to the memory circuit and the operation starts as a consequence of an erroneous determination made by the voltage detector and the power voltage confirmation circuit by the power voltage in the active stage regardless of the fact that the supply of the power voltage is stopped when this semiconductor storage device shifts from the active state into the standby state.

Moreover, in one embodiment, the power voltage supplied from the outside is comprised of at least the first power voltage supplied to the memory circuit including the memory cell array and the second power voltage supplied to the output circuit, and the lockout circuit comprises:

a voltage detector that outputs a first lockout signal for inhibiting the command to the memory circuit including the memory cell array when the first power voltage is not higher than the first prescribed voltage; and a power voltage confirmation circuit that outputs a second lockout signal for inhibiting the command to the memory circuit including the memory cell array when the second power voltage is lower than the second prescribed voltage.

According to the semiconductor storage device of the above-mentioned embodiment, the occurrence of the malfunction of rewrite error and so on attributed to the reduction in the level of the power voltage supplied to the memory circuit including the memory cell array can be prevented by the voltage detector. Furthermore, the occurrence of the malfunction attributed to the reduction in the level of the supplied power voltage can be prevented by the power voltage confirmation circuit with regard to the output circuit that connects the memory circuit including the memory cell array to the outside.

The semiconductor storage device of the present invention comprises power supply switches that stop supplying at least one of a plurality of power voltages supplied from outside when a memory circuit including a memory cell array is in a standby state; and a lockout circuit that inhibits a command to the memory circuit when any one of the plurality of power voltages is lower than a prescribed voltage.

According to the above-mentioned semiconductor storage device, the power consumption attributed to the leak current in the standby state can be reduced by turning off the power supply switch when the memory circuit is in the standby state. Moreover, the command to the memory circuit including the memory cell array is inhibited by the lockout circuit when the power voltage supplied from the outside is lower than the prescribed voltage. Therefore, the malfunction of the rewrite error and so on attributed to the reduction in the level of the power voltage supplied to the memory circuit including the memory cell array can be prevented.

The semiconductor storage device control method of the present invention for inhibiting a command to a memory circuit including a memory cell array comprises the steps of:

stopping supply of at least one of a plurality of power voltages supplied from outside when the memory circuit is in a standby state; and inhibiting the command to the memory circuit when any one of the plurality of power voltages is lower than a prescribed voltage.

According to the above-mentioned semiconductor storage device control method, by virtue of the inclusion of the step of stopping the supply of the power voltage when the memory circuit including the memory cell array is in the standby state, the power consumption attributed to the leak current in the standby stage is reduced, and this allows a long-time operation on the battery in electronic equipment, and particularly in battery-powered portable electronic equipment.

The semiconductor storage device control method of the present invention for inhibiting a command to a memory circuit including a memory cell array comprises the steps of:

investigating whether or not the memory circuit is in a standby state;

stopping supply of the power voltage to the memory circuit and inhibiting the command to the memory circuit when the memory circuit is in the standby state;

confirming at least one of the plurality of power voltages by a power voltage confirmation circuit; and outputting a lockout signal for inhibiting the command from the power voltage confirmation circuit to the memory circuit when any one of the plurality of power voltages is lower than a prescribed voltage.

According to the above-mentioned semiconductor storage device control method, by virtue of the inclusion of the step of stopping the supply of the power voltage and inhibiting the command to the memory circuit when the memory circuit including the memory cell array is in the standby state, the power consumption attributed to the leak current in the standby state can be reduced, and the occurrence of a malfunction caused by the execution of the command after the stop of the supply of the power voltage can be prevented. Furthermore, when at least one of the power voltages is lower than the prescribed voltage, the occurrence of the malfunction of the rewrite error and so on can be prevented by inhibiting the command, and the desired operation can be obtained.

In one embodiment, the command is a rewrite command.

According to the semiconductor storage device control method of the above-mentioned embodiment, by inhibiting the rewrite command, the occurrence of the malfunction attributed to a rewrite command operation error attributed to the level of the power voltage can be prevented, and the desired operation can be obtained.

In one embodiment, at least one of the plurality of power voltages is compared with the prescribed voltage by a comparator.

According to the semiconductor storage device control method of the above-mentioned embodiment, by comparing at least one of the plurality of power voltages with the prescribed voltage by the comparator, the level of the power voltage can be rapidly determined, and the occurrence of a malfunction attributed to the delay of the determination can be prevented.

In one embodiment, supply states of power voltages of the comparator and a voltage generator circuit for generating the prescribed voltage are controlled by a first power voltage supplied to the memory circuit including the memory cell array among the plurality of power voltages.

According to the semiconductor storage device control method of the above-mentioned embodiment, the supply states of the power voltages of the comparator and the voltage generator circuit are controlled by the first power voltage supplied to the memory circuit including the memory cell array among the plurality of power voltages. By this operation, when, for example, the first power voltage is lower than the predetermined voltage, the power voltage confirmation circuit puts the comparator and the voltage generator circuit into an ON state regardless of the state of the second power voltage supplied to the output circuit. Consequently, particularly when the power voltage rises, the determination of the second power voltage supplied to the output circuit can be rapidly executed.

Moreover, in one embodiment, a voltage detector detects whether or not a first power voltage supplied to the memory circuit including the memory cell array among the plurality of power voltages is outside a predetermined range, and a lockout signal for inhibiting the command to the memory circuit is outputted from the voltage detector when the first power voltage is outside the predetermined range.

According to the semiconductor storage device control method of the above-mentioned embodiment, by inhibiting the command to the memory circuit by the voltage detector when the first power voltage is outside the predetermined range, the lockout signal (signal for inhibiting the command) can be rapidly transmitted to the memory circuit regardless of the state of the power voltage confirmation circuit, so that the malfunction attributed to the delay of the transmission of the lockout signal can be prevented.

Moreover, in one embodiment, the command to the memory circuit including the memory cell array is inhibited when at least one of the lockout signal from the voltage detector and the lockout signal from the power voltage confirmation circuit is outputted.

According to the semiconductor storage device control method of the above-mentioned embodiment, by inhibiting the command to the memory circuit including the memory cell array as a consequence of the output of at least one of the lockout signal from the voltage detector and the lockout signal from the power voltage confirmation circuit, the occurrence of the malfunction attributed to the reduction in the level of either the first power voltage supplied to the memory circuit including the memory cell array or the second power voltage supplied to the output circuit can be prevented.

In one embodiment, the supply state of a power voltage of the voltage detector is controlled by the first power voltage.

According to the semiconductor storage device control method of the above-mentioned embodiment, with regard to the supply state of the power voltage of the voltage detector, the voltage detector can be put into the OFF state for the sake of power consumption reduction by being controlled by the first power voltage when, for example, the first power voltage becomes equal to or higher than the predetermined voltage and the voltage detector becomes unnecessary.

Moreover, in one embodiment, the lockout signal for inhibiting the command to the memory circuit is outputted from the power voltage confirmation circuit when the power voltage supplied to the output circuit among the plurality of power voltages is lower than the prescribed voltage.

According to the semiconductor storage device control method of the above-mentioned embodiment, by inhibiting the command to the memory circuit by the power voltage confirmation circuit when the power voltage supplied to the output circuit is lower than the prescribed voltage, the occurrence of the command operation error attributed to the reduction in the level of the power voltage supplied to the output circuit can be prevented.

Moreover, in one embodiment, the plurality of power voltages are confirmed by the power voltage confirmation circuit.

According to the semiconductor storage device control method of the above-mentioned embodiment, in the case where the power is turned on, a voltage higher than the predetermined voltage is maintained, thereafter an idling state is established without verifying the power voltage level and subsequently the command is given again to the memory circuit, it is possible to verify whether or not the levels of the plurality of the supplied power voltages are proper by confirming the levels of the plurality of power voltages by the power voltage confirmation circuit.

Moreover, in one embodiment, the command to the memory circuit including the memory cell array is inhibited on the basis of at least one of the plurality of power voltages.

According to the semiconductor storage device control method of the above-mentioned embodiment, if the level of any of the power voltages has an improper level in the active state after the power supply is turned on, the command can be promptly inhibited to promptly prevent the occurrence of the malfunction attributed to the reduction in the level of the power voltage.

Moreover, in one embodiment, the lockout signal for inhibiting the command to the memory circuit is outputted from the power voltage confirmation circuit when the power voltage supplied to the memory circuit including the memory cell array among the plurality of power voltages is outside a predetermined range.

According to the semiconductor storage device control method of the above-mentioned embodiment, by inhibiting the command to the memory circuit when the first power voltage is outside the predetermined range in the active state after the power supply is turned on, the occurrence of the malfunction attributed to the improper voltage level after the idling state can be prevented, and the desired operation can be obtained.

Moreover, in one embodiment, the prescribed voltage for determining the power voltage supplied to the output circuit among the plurality of power voltages is within a range of 0.3 V to 1.2 V.

According to the semiconductor storage device control method of the above-mentioned embodiment, by setting the prescribed voltage within the range of 0.3 V to 1.2 V, the power voltage at the proper level can be supplied according to the size of the transistor even if the power voltage is lowered in accordance with the progress of the fine processing technology, and this allows a semiconductor storage device of less malfunctions to be provided.

The semiconductor storage device of the present invention comprises a memory cell array employing a memory element as a memory cell wherein the memory element is constructed of a gate electrode formed via a gate insulation film on a semiconductor layer, a channel region arranged under the gate electrode, diffusion regions that are arranged on both sides of the channel region and have a conductive type opposite to that of the channel region and memory function bodies that are formed on both sides of the gate electrode and have a function to retain electric charges; and power supply switches that are turned on to supply the power voltage to at least the memory circuit including the memory cell array when the memory circuit is in an active state and that are turned off to stop the supply of the power voltage to at least the memory circuit including the memory cell array when the memory circuit is in a standby state.

According to the semiconductor storage device of the above-mentioned embodiment, by employing the memory element as the memory cell for the memory cell array, storage retention of two bits or more per memory element and stable operation can be achieved even if the device is miniaturized. Moreover, by providing the power supply switches for changeover between supply and stop of the power voltage and stopping the supply of the power by turning off the power supply switch in the standby state, the power consumption attributed to the leak current in the standby stage of this semiconductor storage device can be reduced.

Moreover, in one embodiment, the power supply switches are formed on a substrate identical to that of the memory circuit including the memory cell array.

According to the semiconductor storage device of the above-mentioned embodiment, the power supply switches are formed on the substrate identical to the substrate on which the memory cell array is formed. With this arrangement, the switches can be constructed with a small area.

Moreover, in one embodiment, at least part of memory function bodies possessed by the memory element overlaps with part of a diffusion region.

Moreover, in yet another embodiment, there is provided an insulation film for isolating from the channel region or the semiconductor layer a film which has a surface roughly parallel to a surface of the gate insulation film of the memory element and has a function to retain electric charges, and a film thickness of the insulation film is thinner than a film thickness of the gate insulation film and is not smaller than 0.8 nm.

According to the semiconductor storage device of the above-mentioned embodiment, the semiconductor storage device can operate at higher speed and more stably than in the conventional case.

Moreover, in one embodiment, the memory function bodies possessed by the memory element comprise a film that has a surface roughly parallel to a surface of the gate insulation film and has a function to retain electric charges.

According to the semiconductor storage device of the above-mentioned embodiment, the semiconductor storage device can operate more stably than in the conventional case.

Moreover, the portable electronic equipment of the present invention employs the above-mentioned semiconductor storage device or the control method of the device.

According to the portable electronic equipment of the above-mentioned construction, the portable electronic equipment comprises the semiconductor storage device capable of storing two bits or more per memory element and stably operating even if the device is miniaturized and being easy to miniaturize. This allows a proper voltage having a sufficient current to be supplied during the write and erase operations in the memory element. Therefore, the portable electronic equipment capable of being downsized, improved in performance and reduced in power consumption can be provided.

BEST MODE FOR CARRYING OUT THE INVENTION

Figure 1:
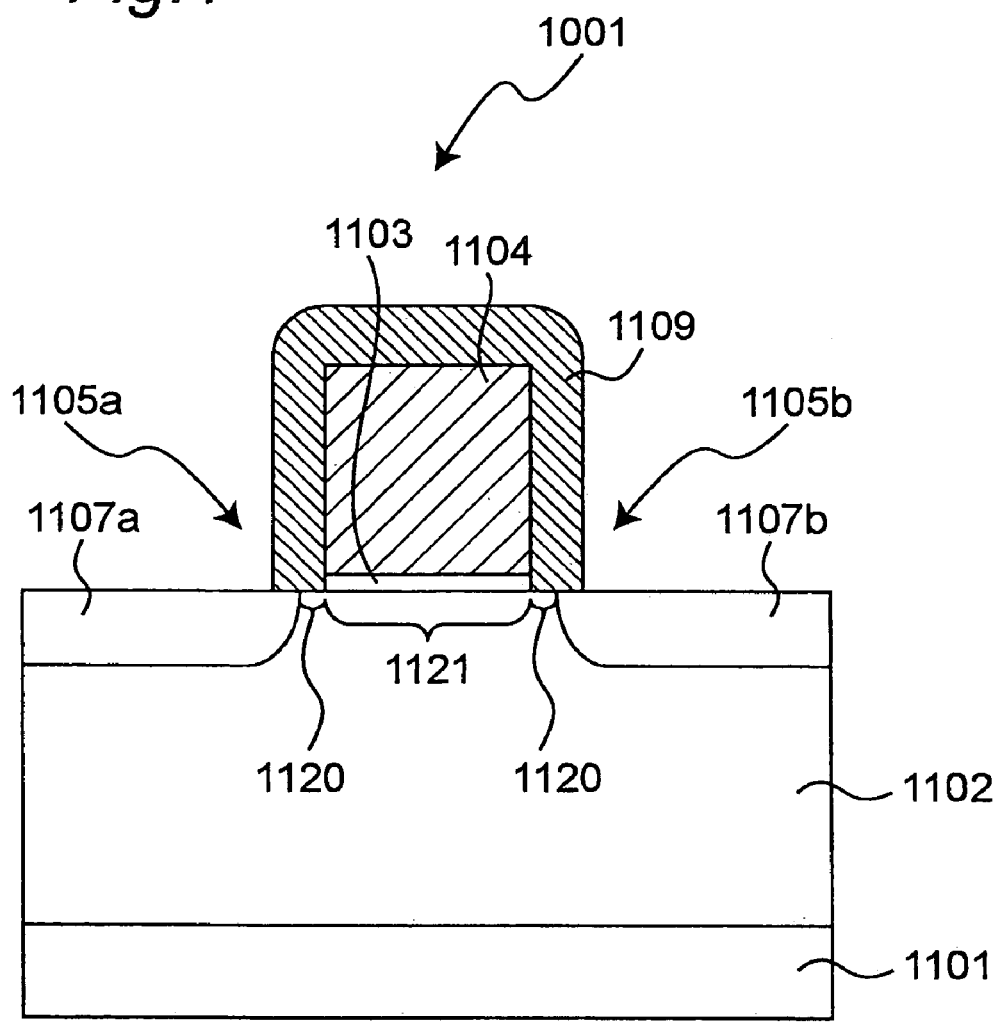
FIG. 1 is a schematic sectional view of the essential part of a memory element in the semiconductor storage device of the first embodiment of the present invention.

An outline of a nonvolatile memory element to be employed in the semiconductor storage device of the present invention will be described first.

The memory element is constructed mainly of a semiconductor layer, a gate insulation film, a gate electrode, a channel region, a diffusion region and a memory function body. In this case, the channel region generally means a region of the same conductive type as that of the semiconductor layer, or a region right under the gate electrode, while the diffusion region means a region of the conductive type opposite to that of the channel region.

In concrete, the memory element of the present invention, which may be constructed of one first conductive type region that is the diffusion region, a second conductive type region that is the channel region, one memory function body arranged across regions of the first and second conductive types, and an electrode provided via the gate insulation film, should properly be constructed of a gate electrode formed on the gate insulation film, two memory function bodies formed on both sides of the gate electrode, two diffusion regions arranged on both sides of the memory function body oppositely to the gate electrode, and a channel region arranged under the gate electrode.

The semiconductor device of the present invention should be formed as a semiconductor layer on a semiconductor substrate or preferably formed on a well region of the first conductive type formed in the semiconductor substrate.

The semiconductor substrate is not specifically limited so long as it is used for a semiconductor device, and there can be enumerated, for example, bulk substrates of elemental semiconductors of silicon, germanium and so on and compound semiconductors of silicon germanium, GaAs, InGaAs, ZnSe, GaN and so on. Moreover, it is acceptable to employ various substrates such as an SOI (Silicon on Insulator) substrate, an SOS (Silicon on Sapphire) substrate and a multi-layer SOI substrate and a glass or plastic substrate on which a semiconductor layer is possessed, as those which have a semiconductor layer on its surface. Among others, a silicon substrate, an SOI substrate on the surface of which a silicon layer is formed or the like, is preferable. The semiconductor substrate or the semiconductor layer may be single crystal (by, for example, epitaxial growth), polycrystal or amorphous although there are variations in the quantity of current flowing inside.

It is preferred that an element isolation region is formed on this semiconductor layer, and a single or multi-layer structure may be formed by a combination of the elements of transistors, capacitors, resistors and so on, circuits of these elements, semiconductor devices and layer insulation films. The element isolation region can be formed of various element isolation films such as a LOCOS (Local Oxidation of Silicon) film, a trench oxide film and an STI (Shallow Trench Isolation) film. The semiconductor layer may have the P-type or the N-type conductive type, and it is preferred that a well region of at least one first conductive type (P-type or N-type) be formed on the semiconductor layer. There can be employed a semiconductor layer and a well region whose impurity concentrations are within the ranges well known in the field. When the SOI substrate is employed as a semiconductor layer, a well region may be formed on the surface semiconductor layer, or a body region may be possessed under the channel region.

The gate insulation film is generally not specifically limited so long as it is used for a semiconductor device, and there can be employed: for example, an insulation film such as a silicon oxide film and a silicon nitride film; a single layer film or a laminate film of a high dielectric film such as an aluminum oxide film, a titanium oxide film, a tantalum oxide film and a hafnium oxide film. Among others, the silicon oxide film is preferable. The gate insulation film should have a film thickness of, for example, about 1 to 20 nm and preferably have a film thickness of about 1 to 6 nm. The gate insulation film may be formed only right under the gate electrode or formed larger (wider) than the gate electrode.

The gate electrode is formed on the gate insulation film normally in a shape for use in a semiconductor device or a shape that has a concave portion in a lower end portion. The gate electrode, which should preferably be formed in an integrated body without being separated by a single layer or multi-layer conductive film, may be arranged in a separated state by the single layer or multi-layer conductive film. Moreover, the gate electrode may have a side wall insulation film on the side wall. The gate electrode is normally not specifically limited so long as it is used for a semiconductor device, and there can be enumerated the conductive films of: for example, polysilicon; metals of copper and aluminum; high-melting-point metals of tungsten, titanium and tantalum; a single layer film or a multilayer film of high-melting-point metal and silicide thereof; and so on. The gate electrode should properly be formed with a film thickness of, for example, about 50 to 400 nm. It is to be noted that a channel region is formed under the gate electrode.

It is preferred that the gate electrode is formed only on the side wall of the memory function body described later or does not cover the upper portion of the memory function body. With this arrangement, a contact plug can be arranged closer to the gate electrode, and therefore, the miniaturization of the memory element is facilitated. Moreover, the memory element, which has a simple arrangement as described above, is easy to manufacture, and the yield can be improved.

The memory function body has at least a function to retain electric charges (hereinafter referred to as a "charge retention function"). In other words, the memory function body has a function to store and retain charges, trap charges or retain a charge polarized state. This function is fulfilled by the memory function body that includes, for example, a film or region having the charge retention function. As a material that fulfills this function, there can be enumerated: silicon nitride; silicon; silicate glass containing impurities of phosphorus, boron or the like; silicon carbide; alumina; high dielectric materials of hafnium oxide, zirconium oxide, tantalum oxide and the like; zinc oxide; ferroelectric substance; metal and so on. Therefore, the memory function body can be formed of a single layer or laminate structure of: an insulation film including a silicon nitride film; an insulation film including a conductive film or a semiconductor layer inside; an insulation film including at least one conductor or semiconductor dot; or an insulation film including a ferroelectric film in which internal charges are polarized by an electric field and the state is retained. Among others, the silicon nitride film, in which a number of levels for trapping charges exist, is therefore able to obtain a great hysteresis characteristic. Moreover, a charge retention time is long, and there occurs no problem of charge leak due to the generation of a leak path, and therefore, a retention characteristic is satisfactory. Furthermore, a silicon nitride film is preferable because it is normally used in the LSI process.

By employing the insulation film, which internally includes the film having the charge retention function, such as a silicon nitride film, as a memory function body, reliability of storage retention can be improved. The reason for the above is that the silicon nitride film is an insulator and the electric charges of the entire silicon nitride film are not lost at once even when the charge leak partially occurs in the film. Moreover, even if a distance between memory elements is reduced and mutually adjacent memory function bodies are brought in contact with each other when a plurality of memory elements are arranged, the information stored in each of the memory function bodies is not lost dissimilarly to the case where the memory function bodies are constructed of a conductor. Furthermore, the contact plug can be arranged closer to the memory function body and arranged so as to overlap with the memory function body in some cases. Therefore, the miniaturization of the memory element is facilitated.

In order to improve the reliability of storage retention, the film that has the charge retention function is not always required to have a film-like shape, and a film having the charge retention function should preferably exist discretely in the insulation film. In concrete, it is preferred that the film having the charge retention function is distributed in a dot-like form in a material that hardly retains electric charges, or, for example, silicon oxide.

When a conductive film or a semiconductor layer is employed as a charge retaining film, it is preferable to arrange the charge retaining film via an insulation film so as not to come in direct contact with neither one of the semiconductor layer (semiconductor substrate, well region, body region, source/drain region or diffusion region) and the gate electrode. As the insulation film, for example, there can be enumerated a laminate structure of a conductive film and an insulation film, a structure in which a conductive film is distributed in a dot-like form in the insulation film, a structure arranged in a part of the side wall insulation film formed on the side wall of the gate and so on.

By employing the insulation film that internally include a conductive film or a semiconductor layer as a memory function body, the amount of electric charges to be injected into the conductor or the semiconductor can be freely controlled, and a multi-value arrangement can easily be provided. Therefore, this arrangement is preferable.

Furthermore, by employing the insulation film that includes at least one conductor or semiconductor dots as a memory function body, the write and erase operations can easily be executed by direct tunneling of electric charges, and low power consumption can be achieved. Therefore, this arrangement is preferable.

Moreover, it is acceptable to use a ferroelectric film such as PZT (lead zirconate titanate) and PLZT (lead lanthanum zirconate titanate) whose polarization direction is changed by an electric field as a memory function body. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase can be achieved. Therefore, this arrangement is preferable.

The insulation film, which constitutes the memory function body, should properly be a region for making it difficult for electric charges to escape or a film that has a function to make it difficult for electric charges to escape. As one that fulfills the function to make it difficult for electric charges to escape, a silicon oxide film and so on can be enumerated.

The charge retaining film included in the memory function body is arranged on both sides of the gate electrode directly or via an insulation film and arranged on the semiconductor layer (semiconductor substrate, well region, body region or source/drain region or diffusion region) directly or via a gate insulation film. It is preferred that the charge retaining films located on both sides of the gate electrode be formed so as to cover the whole or part of the side walls of the gate electrode directly or via an insulation film. According to an example of application, when the gate electrode has a concave portion in its lower end portion, the charge retaining film may be formed so as to be completely or partially buried in the concave portion directly or via an insulation film.

The diffusion region can be made to function as a source/drain region and has a conductive type opposite to that of the semiconductor layer or the well region. A junction of the diffusion region and the semiconductor layer or the well region should preferably have a steep slope of impurity concentration. The reason for the above is that hot electrons and hot holes are efficiently generated at a low voltage, and high-speed operation can be achieved at a lower voltage. The junction depth of the diffusion region is not specifically limited and is allowed to be properly adjusted according to the performance and so on of the semiconductor storage device desired to be obtained. When a SOI substrate is employed as a semiconductor substrate, the diffusion region may have a junction depth smaller than the film thickness of the surface semiconductor layer. However, the diffusion region should preferably have a junction depth almost equal to the film thickness of the surface semiconductor layer.

The diffusion region may be arranged so as to overlap with the gate electrode end or arranged so as to meet the gate electrode end or arranged so as to be offset with respect to the gate electrode end. In particular, in the case of offset, the easiness of inversion of the offset region under the charge retaining film is largely changed by the quantity of charges accumulated in the memory function body when the voltage is applied to the gate electrode, increasing the memory effect and reducing the short-channel effect. Therefore, this arrangement is preferable. However, since a drive current between the diffusion regions (source and drain) is significantly reduced if the offset is excessive, it is preferred that the amount of offset, i.e., a distance from one gate electrode end to the nearer diffusion region in the direction of the gate length should preferably be shorter than the thickness of the charge retaining film in the direction parallel to the gate length direction. What is particularly important is that at least part of the film or region having the charge retention function in the memory function body overlaps with part of the diffusion region. The reason for the above is that the essence of the memory elements that constitute the semiconductor storage device of the present invention is to rewrite the storage by the electric field intersecting the memory function body due to a voltage difference between the gate electrode and the diffusion region existing only in the side wall portion of the memory function body.

The diffusion region may be partially extended to a position higher than the surface of the channel region, i.e., the lower surface of the gate insulation film. In this case, it is proper that a conductive film integrated with this diffusion region is constructed while being laminated on the diffusion region formed in the semiconductor substrate. As the conductive film, there can be enumerated, for example, semiconductor of polysilicon, amorphous silicon or the like, silicide, aforementioned metals, high-melting-point metals and so on. Among others, polysilicon is preferable. The reason for the above is that the polysilicon, of which the impurity diffusion speed is significantly greater than that of the semiconductor layer, easily tolerates a shallowed junction depth of the diffusion region in the semiconductor layer and easily suppresses a short-channel effect. In this case, it is preferable to provide an arrangement that part of this diffusion region and the gate electrode hold at least part of the memory function body therebetween.

The memory element of the present invention can be formed by the ordinary semiconductor process according to a method similar to the method of forming a side wall spacer of a single layer or laminate structure on the side wall of the gate electrode. In concrete, there can be enumerated: a method for forming a gate electrode, thereafter forming a single layer film or a multilayer film including a film having the charge retention function (hereinafter referred to as a "charge retaining film"), a charge retaining film such as a charge retaining film/insulation film, an insulation film/ charge retaining film and an insulation film/charge retaining film/insulation film and leaving these films in a side wall spacer shape by etching back under appropriate conditions; a method for forming an insulation film or a charge retaining film, leaving the films in a side wall spacer shape by etching back under appropriate conditions, further forming a charge retaining film or an insulation film and leaving the films in a side wall spacer shape by etching back under appropriate conditions; a method for coating or depositing an insulation film material in which a particulate charge retaining material is distributed on a semiconductor layer including a gate electrode, and leaving the insulation film material in a side wall spacer shape by etching back under appropriate conditions; a method for forming a gate electrode, thereafter forming the single layer film or the multilayer film and carrying out patterning by using a mask and so on. Moreover, there can be enumerated a method for forming a charge retaining film, a charge retaining film/insulation film, an insulation film/charge retaining film, an insulation film/ charge retaining film/insulation film and so on before forming the gate electrode, forming an opening in a region that becomes a channel region of these films, forming a gate electrode material film on the entire upper surface and patterning this gate electrode material film in a shape, which is larger than the opening and includes the opening and so on.

One example of the formation process of this memory element will be described.

First of all, a gate insulation film and a gate electrode are formed on a semiconductor substrate according to a well-known procedure. Subsequently, a silicon oxide film is formed by the thermal oxidation method to a film thickness of 0.8 to 20 nm, or more preferably to a film thickness of 3 to 10 nm or deposited by the CVD (Chemical Vapor Deposition) method on the entire upper surface of the semiconductor substrate. Next, a silicon nitride film is deposited by the CVD method to a film thickness of 2 to 15 nm or more preferably to a film thickness of 3 to 10 nm on the entire upper surface of the silicon oxide film. Further, a silicon oxide film is deposited to a film thickness of 20 to 70 nm on the entire surface of the silicon nitride film by the CVD method.

Subsequently, by etching back the silicon oxide film/ silicon nitride film/silicon oxide film by anisotropic etching, a memory function body appropriate for storage is formed in a side wall spacer shape on the side wall of the gate electrode.

Subsequently, by injecting ions using the gate electrodes and the memory function body in the side wall spacer shape used as a mask, a diffusion layer region (source/drain region) is formed. Subsequently, it is proper to carry out a silicide process or an upper portion wiring process according to a well-known procedure.

When a memory cell array is constructed by arranging the memory elements of the present invention, the best mode of the memory elements is to satisfy, for example, all the required conditions:

(1) the function of the word line is possessed by the integrated body of the gate electrodes of a plurality of memory elements;

(2) the memory function bodies are formed on both sides of the word line;

(3) electric charges in the memory function bodies are retained by an insulator, or in particular, a silicon nitride film;

(4) the memory function bodies are constructed of an ONO (Oxide Nitride Oxide) film, and the silicon nitride film has a surface roughly parallel to the surface of the gate insulation film;

(5) the silicon nitride film in each memory function body is separated by the word line, the channel region and the silicon oxide film;

(6) the silicon nitride film in each memory function body overlaps with the diffusion region;

(7) the thickness of the insulation film, which separates the silicon nitride film that has a surface roughly parallel to the surface of the gate insulation film from the channel region or the semiconductor layer differs from the thickness of the gate insulation film;

(8) write and erase operations of one memory element are executed by a single word line;

(9) there is no electrode (word line) that has a function to assist the write and erase operations on each memory function body; and

(10) the portion put in contact with the diffusion region right under each memory function body has a region where the impurity concentration of the conductive type opposite to the conductive type of the diffusion region is high. It is to be noted that the memory elements may satisfy at least one of these requirements.

The most preferable combination of the aforementioned requirements resides, for example, in that (3) electric charges in the memory function bodies are retained by an insulator, or in particular, a silicon nitride film, (6) the insulation film (silicon nitride film) in each memory function body overlaps with the diffusion region, and (9) there is no electrode (word line) that has a function to assist the write and erase operations on each memory function body.

When the requirement (3) and the requirement (9) are satisfied, the memory elements are very useful as follows. First of all, a bit line contact can be arranged closer to the memory function body located on the word line side wall, or even if the memory elements are put close to each other in distance, the plurality of memory function bodies do not interfere with one another, and the storage information can be retained. Therefore, the miniaturization of the memory elements is facilitated. When the charge retaining region in the memory function body is a conductor, interference occurs between the charge retaining regions as the distance between the memory elements is reduced by capacitive coupling, and the storage information cannot be retained.

Moreover, when the charge retaining region in the memory function body is an insulator (e.g., silicon nitride film), there is no need to make each memory function body independent of each memory cell. For example, the memory function bodies formed on both sides of one word line shared by a plurality of memory cells are not required to be isolated every memory cell, and it is possible to share the memory function bodies formed on both sides of one word line by a plurality of memory cells that share the word line. Therefore, the photoetching process for isolating the memory function bodies become unnecessary, and the manufacturing process is simplified. Furthermore, the position alignment margin of the photolithography process and the film etching margin become unnecessary. Therefore, the margin between the memory cells can be reduced. Therefore, even if the formation is carried out on the same microfabrication level, the memory cell occupation area can be miniaturized in comparison with the case where the charge retaining region in the memory function body is a conductor (e.g., polycrystalline silicon film). When the charge retaining region in the memory function body is a conductor, there is needed a photoetching process for separating the memory function bodies every memory cell, and there are needed a photo position alignment margin and a film etching margin.

Furthermore, since there is a simple element structure that has no electrode having the function to assist the write and erase operations on the memory function bodies, the number of processes is reduced, and the yield can be improved. Therefore, consolidation with the transistors that constitute a logic circuit and an analog circuit can be facilitated, and an inexpensive semiconductor storage device can be obtained.

Moreover, the device is more useful when the requirements (3) and (9) are satisfied and the requirement (6) is satisfied. That is, by making the charge retaining region and the diffusion region in each memory function body overlap with each other, the write and erase operations can be executed at a very low voltage. In concrete, the write and erase operations can be executed at a low voltage of not higher than 5 V. This operation produces a very large effect in terms of circuit design. There is no need to make a high voltage in a chip dissimilarly to the flash memory, and therefore, the charge pump circuit, which requires an enormous occupation area, can be eliminated or reduced in scale. Particularly, when a small-scale capacity memory for adjustment is built in a logic LSI, the occupation area of the memory section is dominated by the occupation area of the peripheral circuit for driving the memory cells than the memory cells. Therefore, it is most effective to eliminate or reduce the scale of the memory cell voltage booster circuit in order to reduce the chip size.

When the requirement (3) is not satisfied or when electric charges are retained by a conductor in the memory function body, the write operation can be executed even when the requirement (6) is not satisfied, or when the conductor in the memory function body and the diffusion region do not overlap with each other. This is because the conductor in the memory function body executes write assist by capacitive coupling with the gate electrode.

Moreover, when the requirement (9) is not satisfied, or when there is an electrode that has the function to assist the write and erase operations on the memory function body, the write operation can be executed even when the requirement (6) is not satisfied, or when the insulator in the memory function body and the diffusion region do not overlap with each other.

In the semiconductor storage device of the present invention, the memory element may be connected in series to a transistor on one side or both sides or consolidated with a logic transistor on an identical chip. In the above case, the semiconductor device of the present invention, or in particular, the memory element can be formed through processes that has very high affinity for the formation processes of ordinary standard transistors of transistors, logic transistors and the like, and therefore, they can be concurrently formed. Therefore, the process of consolidating the memory elements with the transistors or the logic transistors becomes very simple, and an inexpensive consolidated device can be obtained.

In the semiconductor storage device of the present invention, the memory element can store binary or more information in one memory function body, and this allows the element to function as a memory element that stores four values or more information. The memory element may store only binary information. Moreover, it is possible to make the memory element function as a memory cell that has both the functions of a select transistor and a memory transistor by the variable resistor effect of the memory function body.

By being combined with a logic element, a logic circuit or the like, the semiconductor storage device of the present invention can be effectively widely applied to data processing systems of personal computers, notebook type computers, laptop type computers, personal assistant/transmitters, mini computers, workstations, mainframes, multi-processor computers or any other types of computers; electronic components that constitute a data processing system, such as CPU's, memories and data storage devices; communication equipment such as telephones, PHS's (Personal Handy phone Systems), modems and routers; image display equipment such as display panels and projectors; business machines such as printers, scanners and copiers; imaging equipment such as video cameras and digital cameras; amusement equipment such as game machines and music players; information equipment of portable information terminals, watches and electronic dictionaries; car equipment such as car navigation systems and car audio devices; AV (Audio Visual) equipment for recording and reproducing information of animations, still pictures and music; electrical appliances such as washing machines, microwave ovens, refrigerators, rice cookers, dish washers, vacuum cleaners and air conditioners; healthcare equipment such as massage machines, scales and sphygmomanometers; and electronic equipment such as portable storage devices of IC cards, memory cards and so on. In particular, the applications to the portable electronic equipment of portable telephones, portable information terminals, IC cards, memory cards, portable computers, portable game machines, digital cameras, portable animation players, portable music players, electronic dictionaries and watches are effective. It is to be noted that the semiconductor storage device of the present invention may be integrated as at least part of the control circuit of electronic equipment or a data storage circuit or detachably integrated at need.

Embodiments of the semiconductor storage device and the portable electronic equipment of the present invention will be described in detail below with reference to the drawings.

First Embodiment

The semiconductor storage device of this embodiment is provided with a memory element 1001 that serves as one example of the nonvolatile memory element as shown in FIG. 1.

In the memory element 1001, a gate electrode 1104 is formed on a P-type well region 1102 formed via a gate insulation film 1103 on the surface of a semiconductor substrate 1101. A silicon nitride film 1109, which has a trap level for retaining electric charges and serves as a charge retaining film, is arranged on the upper surface and the side surfaces of the gate electrode 1104, and the portions of the silicon nitride film 1109 located on both side walls of the gate electrode 1104 serve as memory function bodies 1105a and 1105b for actually retaining electric charges. In this case, the memory function body means a portion where electric charges are actually accumulated by the rewrite operation in the memory function body or the charge retaining film. N-type diffusion regions 1107a and 1107b, which function as a source region and a drain region, respectively, are formed on both sides of the gate electrode 1104 and inside the P-type well region 1102. The diffusion regions 1107a and 1107b have an offset structure. That is, the diffusion regions 1107a and 1107b do not reach the region 1121 located under the gate electrode, and the offset regions 1120 under the charge retaining film (silicon nitride film 1109) constitute part of the channel region.

Figure 2A:
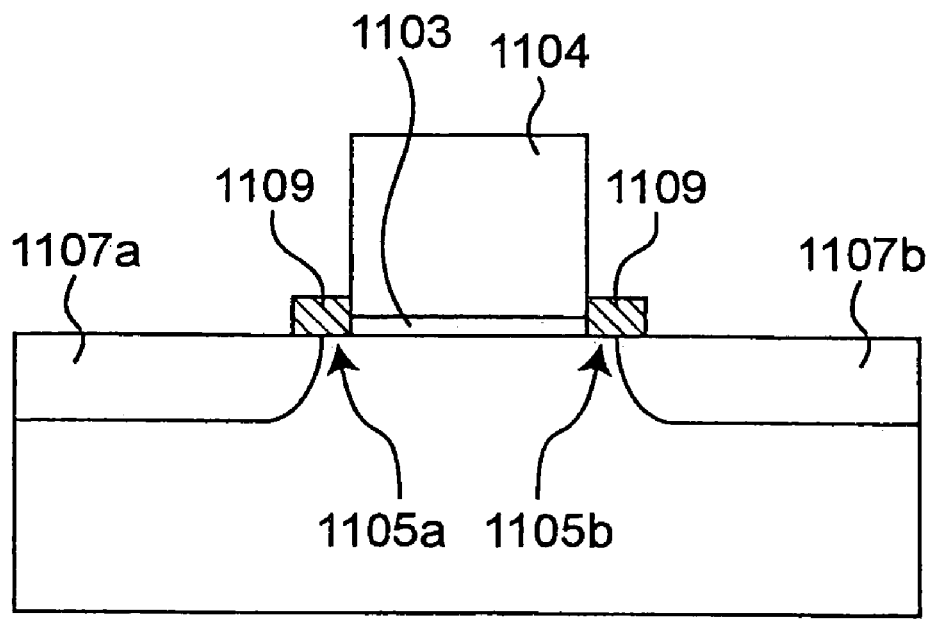
FIGS. 2A and 2B are schematic sectional views of the essential part of memory elements in the semiconductor storage device of the modified first embodiment of the present invention.
Figure 2B:
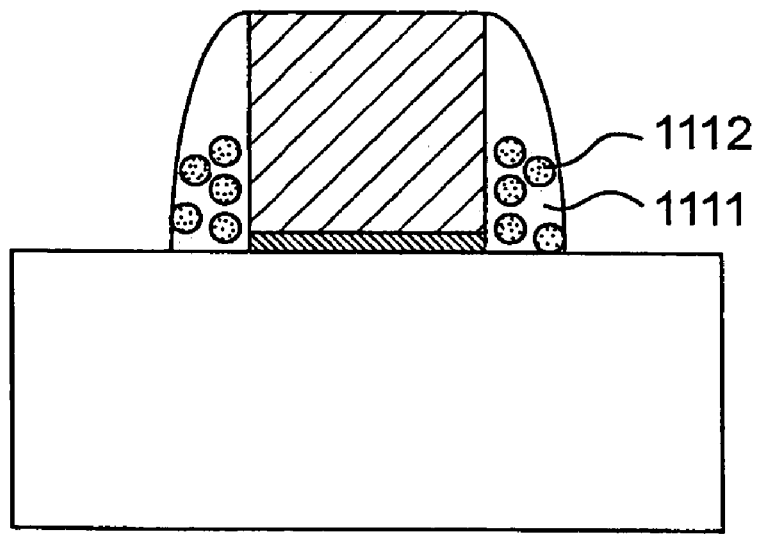

It is to be noted that the memory function bodies 1105a and 1105b, which substantially retain electric charges, are both sides wall portions of the gate electrode 1104. Therefore, the silicon nitride film 1109 is only required to be formed in the regions corresponding to these portions (see FIG. 2A). Moreover, the memory function bodies 1105a and 1105b may have a structure in which particles 1112 constructed of a conductor or a semiconductor of a nanometer size are distributed in scattered dots in an insulation film 1111 (see FIG. 2B) In this case, it is difficult for an electric charge to tunnel its way through the dots since the quantum effect is excessive when the particle 1112 has a size smaller than 1 nm, and no remarkable quantum effect appears at the room temperature when the size exceeds 10 nm. Therefore, the diameter of the particle 1112 should preferably be within a range of 1 nm to 10 nm. Furthermore, the silicon nitride films 1109, which become charge retaining films, may be formed in a side wall spacer shape on the side surfaces of the gate electrode (see FIG. 3).

The principle of write operation of the memory element will be described with reference to FIG. 3 and FIG. 4. In this case, the description is based on the case where the entire bodies of the memory function bodies 1131a and 1131b have a function to retain electric charges. Moreover, the term of "write" means the injection of electrons into the memory function bodies 1131a and 1131b when the memory element is the N-channel type. Hereinafter, the description is provided on the assumption that the memory element is the N-channel type.

Figure 3:
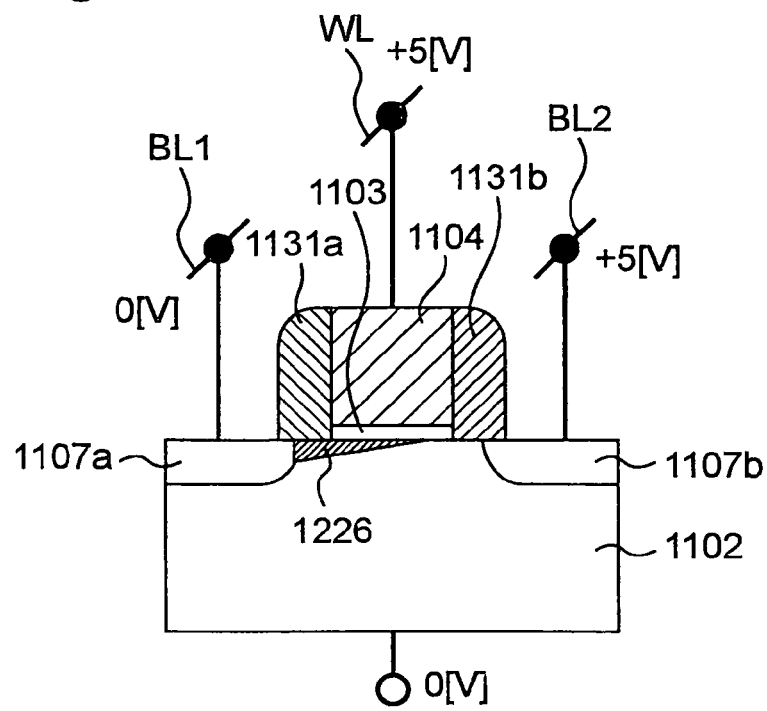
FIG. 3 is a view for explaining the write operation of the memory element in the semiconductor storage device of the first embodiment.

In order to inject an electron (execute write) into the second memory function body 1131b, as shown in FIG. 3, an N-type first diffusion region 1107a and an N-type second diffusion region 1107b are made to serve as a source electrode and a drain electrode, respectively. For example, a voltage of 0 V is applied to the first diffusion region 1107a and the P-type well region 1102, a voltage of +5 V is applied to the second diffusion region 1107b, and a voltage of +5 V is applied to the gate electrode 1104. According to the above-mentioned voltage conditions, an inversion layer 1226 extends from the first diffusion region 1107a (source electrode), but it does not reach the second diffusion region 1107b (drain electrode), generating a pinch-off point. An electron is accelerated from the pinch-off point to the second diffusion region 1107b (drain electrode) by a high electrical field and becomes a so-called hot electron (high energy conduction electron). Write is executed by the injection of this hot electron into the second memory function body 1131b. Since no hot electron is generated in the vicinity of the first memory function body 1131a, write is not executed.

Figure 4:
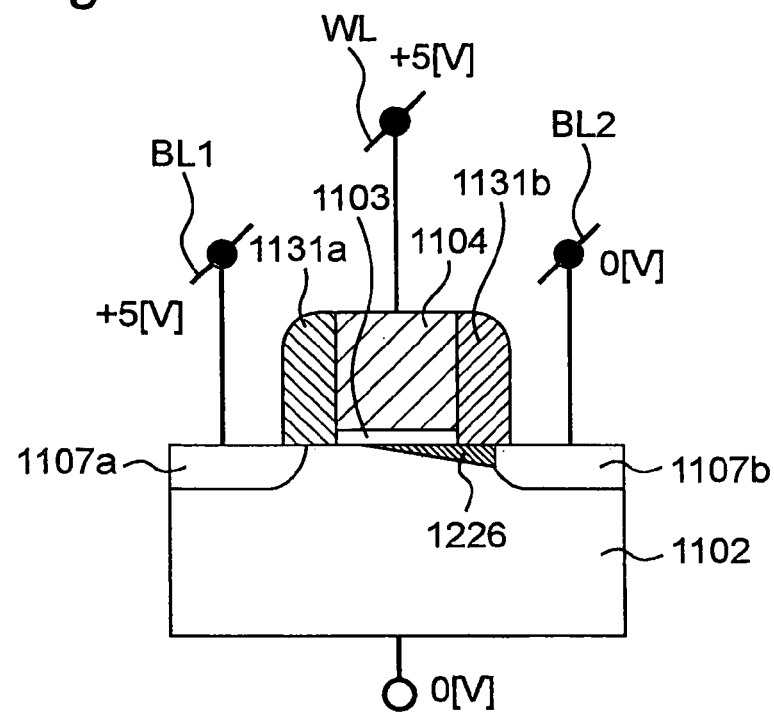
FIG. 4 is a view for explaining the write operation of the memory element in the semiconductor storage device of the first embodiment.

On the other hand, in order to inject an electron (execute write) into the first memory function body 1131a, as shown in FIG. 4, the second diffusion region 1107b and the first diffusion region 1107a are made to serve as the source electrode and the drain electrode, respectively. For example, a voltage of 0 V is applied to the second diffusion region 1107b and the P-type well region 1102, a voltage of +5 V is applied to the first diffusion region 1107a, and a voltage of +5 V is applied to the gate electrode 1104. As described above, by exchanging the source and drain regions reversely to the case where an electron is injected into the second memory function body 1131b, write can be executed by injecting an electron into the first memory function body 1131a.

Next, the principle of erase operation of the memory element will be described with reference to FIG. 5 and FIG. 6.

Figure 5:
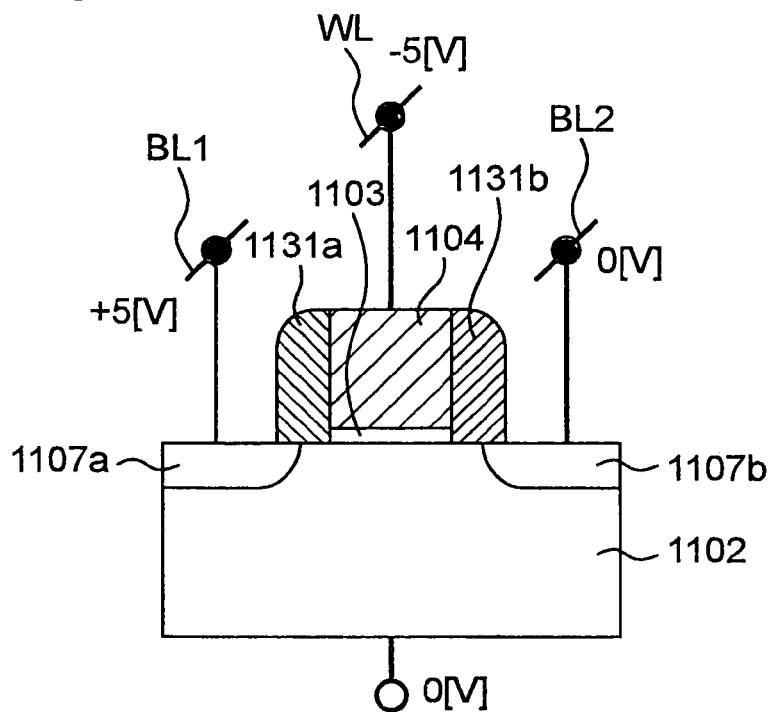
FIG. 5 is a view for explaining the erase operation of the memory element in the semiconductor storage device of the first embodiment.

According to a first method for erasing the information stored in the first memory function body 1131a, as shown in FIG. 5, a positive voltage (e.g., +5 V) is applied to the first diffusion region 1107a, a voltage of 0 V is applied to the P-type well region 1102, a reverse bias is applied to a PN junction of the first diffusion region 1107a and the P-type well region 1102, and a negative voltage (e.g., −5 V) is further applied to the gate electrode 1104. At this time, the potential slope becomes steep, in particular, in the vicinity of the gate electrode 1104 at the PN junction due to the influence of the gate electrode to which the negative voltage is applied. Accordingly, a hot hole (high energy hole) is generated on the P-type well region 1102 side of the PN junction due to band-to-band tunneling. This hot hole is drawn toward the gate electrode 1104 that has a negative potential, and consequently, the hole is injected into the first memory function body 1131a. As described above, the erase of the first memory function body 1131a is executed. In this case, it is proper to apply a voltage of 0 V to the second diffusion region 1107b.

When erasing the information stored in the second memory function body 1131b, it is proper to exchange the potential of the first diffusion region with the potential of the second diffusion region in the aforementioned case.

Figure 6:
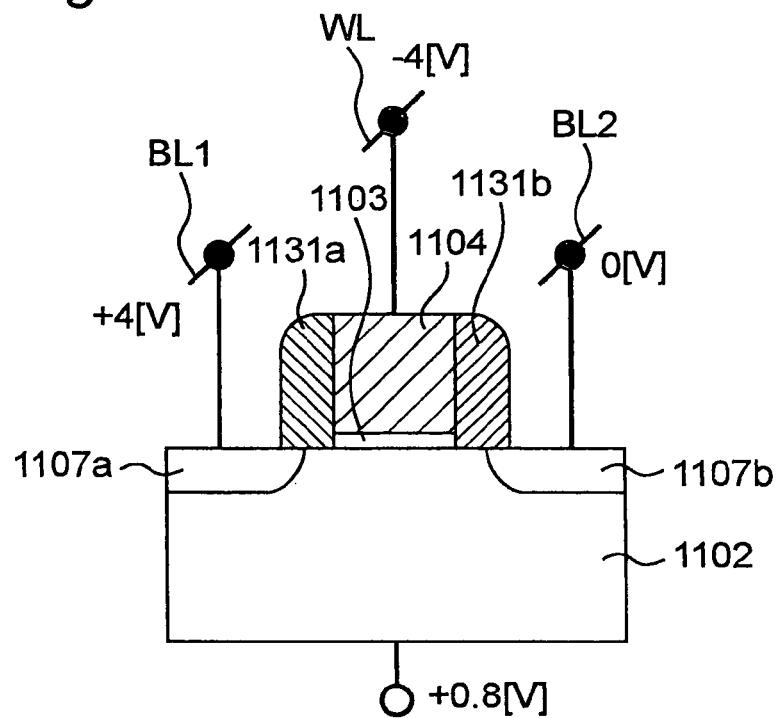
FIG. 6 is a view for explaining the erase operation of the memory element in the semiconductor storage device of the first embodiment.

According to a second method for erasing the information stored in the first memory function body 1131a, as shown in FIG. 6, a positive voltage (e.g., +4 V) is applied to the first diffusion region 1107a, a voltage of 0 V is applied to the second diffusion region 1107b, a negative voltage (e.g., −4 V) is applied to the gate electrode 1104, and a positive voltage (e.g., +0.8 V) is applied to the P-type well region 1102. In this case, a forward voltage is applied across the P-type well region 1102 and the second diffusion region 1107b, injecting an electron into the P-type well region 1102. The injected electron diffuses to a PN junction of the P-type well region 1102 and the first diffusion region 1107a and become hot electrons by being accelerated there by an intense electric field. This hot electron generates an electron-hole pair at the PN junction. That is, by applying the forward voltage across the P-type well region 1102 and the second diffusion region 1107b, the electron injected into the P-type well region 1102 becomes a trigger to generate a hot hole at the PN junction located on the opposite side. The hot hole generated at the PN junction is drawn toward the gate electrode 1104 that has a negative potential, and consequently, the hole is injected into the first memory function body 1131a.

According to this method, even when only a voltage insufficient for the generation of a hot hole by band-to-band tunneling is applied to the PN junction of the P-type well region and the first diffusion region 1107a, the electron injected from the second diffusion region 1107b becomes a trigger to generate an electron-hole pair at the PN junction, allowing a hot hole to be generated. Therefore, the voltage during the erase operation can be lowered. Particularly, when an offset region 1120 (see FIG. 1) exists, the effect that the PN junction becomes steep due to the gate electrode to which the negative potential is applied is a little, and therefore, it is difficult to generate a hot hole by band-to-band tunneling. The second method makes up for the defect, and the erase operation can be achieved at a low voltage.

In erasing the information stored in the first memory function body 1131a, a voltage of +5 V must to be applied to the first diffusion region 1107a according to the first erase method, whereas a voltage of +4 V is sufficient according to the second erase method. As described above, according to the second method, the voltage during erase can be reduced. Therefore, power consumption is reduced, and the deterioration of the memory element due to the hot carrier can be restrained.

Moreover, by either one of the erase methods, overerase does not easily occur in the memory element. The term of "overerase" here is a phenomenon that the threshold value is lowered without saturation as the amount of holes accumulated in the memory function body increases. This is a serious problem in EEPROM (Electrically Erasable Programmable Read-Only Memory) represented by a flash memory, and there occurs a fatal malfunction that memory cell selection becomes impossible particularly when the threshold value becomes negative. On the other hand, in the memory element of the semiconductor storage device of the present invention, only electrons are induced under the memory function bodies even when a large amount of holes are accumulated in the memory function body, and almost no influence is exerted on the potential of the channel region under the gate insulation film. The threshold value during erase is determined by the potential under the gate insulation film, and therefore, overerase does not easily occur.

Figure 7:
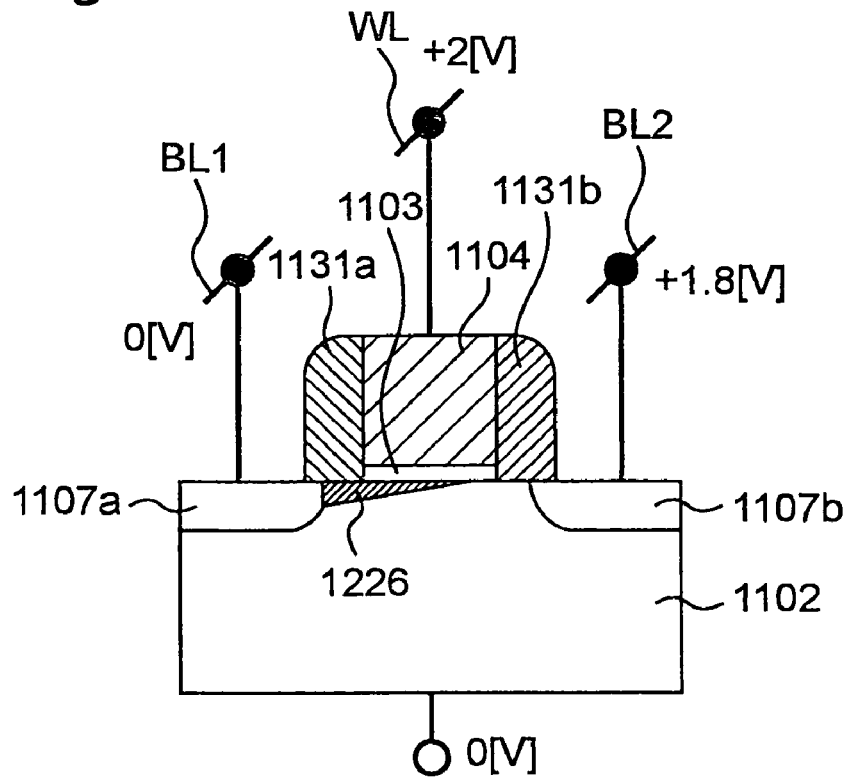
FIG. 7 is a view for explaining the read operation of the memory element of the semiconductor storage device of the first embodiment.

The principle of read operation of the memory element will be further described with reference to FIG. 7.

In reading the information stored in the first memory function body 1131a, the transistor is operated by making the first diffusion region 1107a and the second diffusion region 1107b serve as a source electrode and a drain electrode, respectively. For example, a voltage of 0 V is applied to the first diffusion region 1107a and the P-type well region 1102, a voltage of +1.8 V is applied to the second diffusion region 1107b, and a voltage of +2 V is applied to the gate electrode 1104. In this case, when no electron is accumulated in the first memory function body 1131a, a drain current easily flows. When electrons are accumulated in the first memory function body 1131a, the inversion layer is not easily formed in the vicinity of the first memory function body 1131a, and therefore, a drain current hardly flows. Therefore, by detecting the drain current, the storage information of the first memory function body 1131a can be read. In particular, when read is executed by giving a voltage that causes the pinch-off operation, the state of charges accumulated in the first memory function body 1131a can be more accurately determined without being influenced by the presence or absence of charges in the memory function body 1131b.

In reading the information stored in the second memory function body 1131b, the transistor is operated by making the second diffusion region 1107b and the first diffusion region 1107a serve as the source electrode and the drain electrode, respectively. Although not shown, it is proper to apply, for example, a voltage of 0 V to the second diffusion region 1107b and the P-type well region 1102, apply a voltage of +1.8 V to the first diffusion region 1107a and apply a voltage of +2 V to the gate electrode 1104. As described above, by exchanging the source and drain regions reversely to the case where the information stored in the first memory function body 1131a is read, the information stored in the second memory function body 1131b can be read.

If the channel region (offset regions 1120) that is not covered with the gate electrode 1104 is left, then the inversion layer is lost or formed depending on the presence or absence of surplus electric charges of the memory function bodies 1131a and 1131b in the channel region that is not covered with the gate electrode 1104, and consequently, a great hysteresis (a change in the threshold value) is obtained. It is to be noted that the drain current is largely reduced when the width of the offset region 1120 is excessively large, and the read speed is significantly slowed. Therefore, it is preferable to determine the width of the offset region 1120 so that sufficient hysteresis and read speed can be obtained.

Even when the diffusion regions 1107a and 1107b reached the ends of the gate electrode 1104, i.e., even when the diffusion regions 1107a and 1107b and the gate electrode 1104 overlapped with each other, the threshold value of the transistor was scarcely changed by the write operation.

However, a parasitic resistance at the ends of the source and drain is largely changed, and the drain current is largely reduced (by an order of magnitude or more). Therefore, read can be executed by detecting the drain current, and a function as a memory can be obtained. However, when a larger memory hysteresis effect is needed, it is preferred that the diffusion regions 1107*a* and 1107*b* do not overlap with the gate electrode 1104 (the offset region 1120 exists).

By the aforementioned operation method, 2-bit write and erase per transistor can be selectively achieved. Moreover, by arranging memory elements with a word line WL connected to the gate electrodes 1104 of the memory elements and with a first bit line BL1 and a second bit line BL2 connected to the first diffusion regions 1107*a* and the second diffusion regions 1107*b*, respectively, a memory cell array can be constructed.

Moreover, according to the aforementioned operation method, the 2-bit write and erase per transistor are executed by exchanging the source electrode with the drain electrode. However, the device may be operated as a 1-bit memory by fixing the source electrode and the drain electrode. In this case, it is possible to make one of the source and drain regions have a common fixed voltage, and the number of bit lines connected to the source and drain regions can be reduced by half.

As is apparent from the above description, in the memory element of the semiconductor storage device of the present invention, the memory function bodies are formed independently of the gate insulation film and formed on both sides of the gate electrode, and therefore, the 2-bit operation can be achieved. Moreover, the memory function bodies are separated by the gate electrode, and therefore, interference during rewrite is effectively restrained. Furthermore, the gate insulation film, which is separated from the memory function body, can therefore restrain the short-channel effect by being reduced in film thickness. Therefore, the miniaturization of the memory element and also the semiconductor storage device is facilitated.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Moreover, the thickness and the size of the layers and portions described in the present patent specification are the dimensions of the final shapes in the stage in which the formation of the semiconductor device is completed unless specifically described. Therefore, it is to be noted that the dimensions of the final shapes somewhat change depending on the thermal history and so on of the subsequent processes in comparison with the dimensions immediately after the formation of the films, the impurity regions and so on.

Second Embodiment

Figure 8:
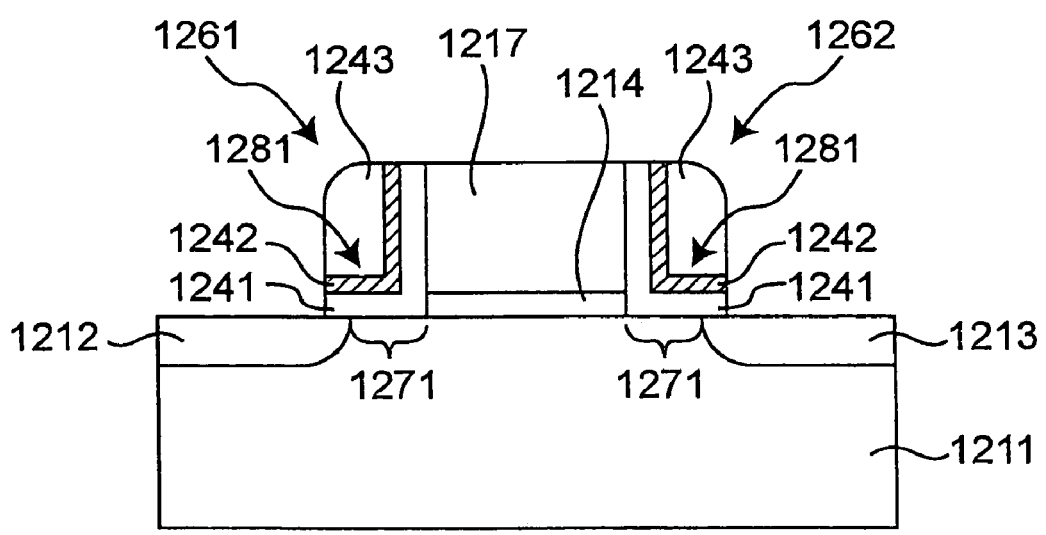
FIG. 8 is a schematic sectional view of the essential part of a memory element in the semiconductor storage device of the second embodiment of the present invention.

As shown in FIG. 8, the memory element in the semiconductor storage device of the present embodiment has a construction substantially similar to that of the memory element 1001 of FIG. 1 except for the memory function bodies 1261 and 1262 are constructed of a region for retaining electric charges (this may be a region for storing electric charges, or a film having the function to retain electric charges) and a region for restraining the escape of electric charges (this may be a film that has a function to restrain the escape of electric charges).

From the point of view of improving the retention characteristic of the memory, the memory function body should preferably include a charge retaining film having the function to retain electric charges and an insulation film. This embodiment employs a silicon nitride film 1242 that has a level for trapping electric charges as a charge retaining film and silicon oxide films 1241 and 1243 that have the operation of preventing the dissipation of electric charges accumulated in the charge retaining film as an insulation film. By the memory function body that including the charge retaining film and the insulation film, the retention characteristic can be improved by preventing the dissipation of electric charges. Moreover, the volume of the charge retaining film can be moderately reduced in comparison with the case where the memory function body is constructed only of the charge retaining film, and the occurrence of a characteristic change due to the movement of electric charges during the retention of the storage can be restrained by limiting the movement of electric charges in the charge retaining film. Furthermore, with the structure in which the silicon nitride film 1242 is held between the silicon oxide films 1241 and 1243, charge injection efficiency during the rewrite operation is increased, and higher-speed operation becomes possible. In this memory element, the silicon nitride film 1242 may be replaced by a ferroelectric substance.

Also, the region (silicon nitride film 1242) for holding electric charges in the memory function bodies 1261, 1262 are overlapped with the diffusion layer regions 1212, 1213. Herein, the term "overlap" is used to refer to the state that at least part of the region (silicon nitride film 1242) for holding electric charges is present on at least part of the diffusion layer regions 1212, 1213. It is noted that there are shown a semiconductor substrate 1211, a gate insulating film 1214, and an offset region 1271 between the gate electrode 1217 and the diffusion layer regions 1212, 1213. Though unshown in the drawing, the uppermost surface of the semiconductor substrate 1211 under the gate insulating film 1214 is a channel region.

An effect produced by the arrangement that the silicon nitride film 1242 serving as the region for retaining electric charges in the memory function bodies 1261 and 1262 overlap with the diffusion regions 1212 and 1213 will be described.

Figure 9:
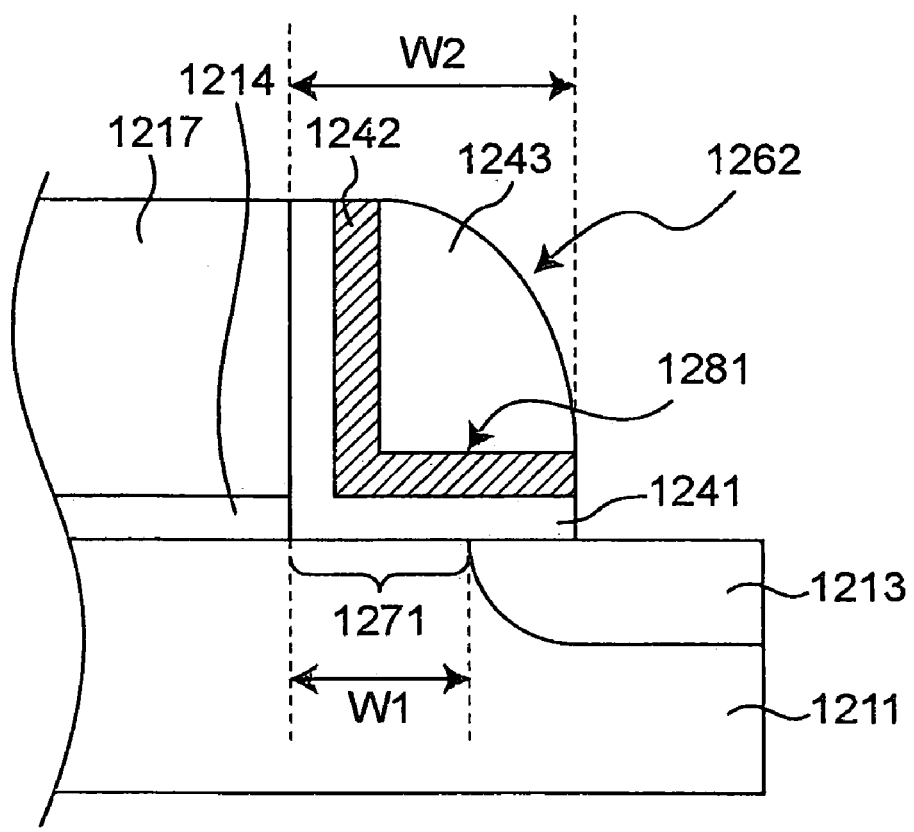
FIG. 9 is an enlarged schematic sectional view of the essential part of the semiconductor storage device of the second embodiment.

As shown in FIG. 9, assuming that the amount of offset of a gate electrode 1217 with respect to a diffusion region 1213 is W1 and that the width of a memory function body 1262 in a cross-sectional plane in the channel-length direction of the gate electrode 1217 is W2 in the peripheral portions of the memory function body 1262, then the amount of overlap of the memory function body 1262 with the diffusion region 1213 is expressed by W2−W1. What is important here is that the memory function body 1262 constructed of the silicon nitride film 1242 of the memory function body 1262 overlaps with the diffusion region 1213, i.e., the arrangement that the relation: W2>W1 is satisfied.

In FIG. 9, the end of the silicon nitride film 1242 remote from the gate electrode 1217 coincided with the end of the memory function body 1262 remote from the gate electrode 1217 at the memory function body 1262. Therefore, the width of the memory function body 1262 was defined as W2.

Figure 10:
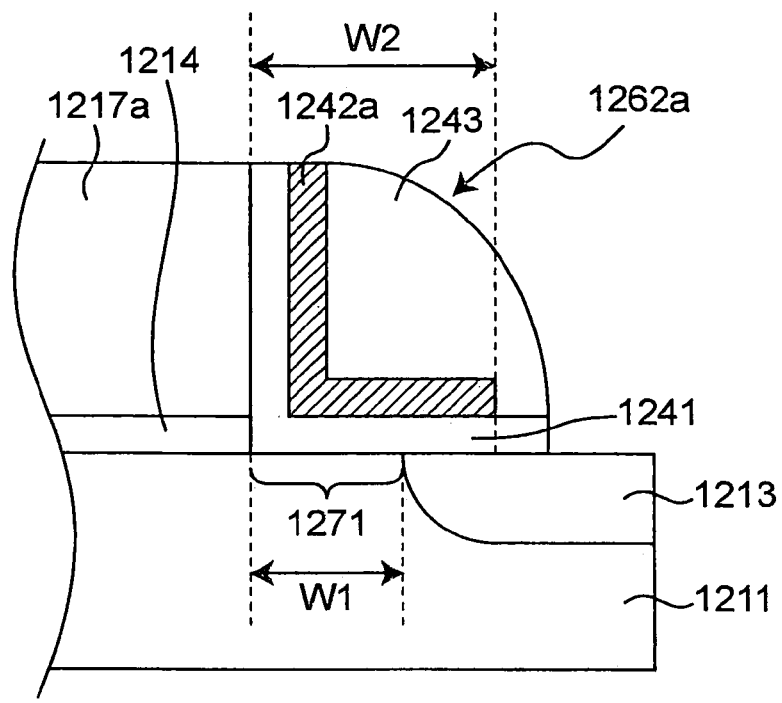
FIG. 10 is an enlarged schematic sectional view of the essential part of the semiconductor storage device of the modified second embodiment.

In the case where an edge of a silicon nitride film 1242a on the side away from the gate electrode in a memory function body 1262a is not aligned with an edge of the memory function body 1262a on the side away from the gate electrode as shown in FIG. 10, W2 may be defined as the width from the edge of the gate electrode to the edge of the silicon nitride film 1242a on the side away from the gate electrode.

Figure 11:
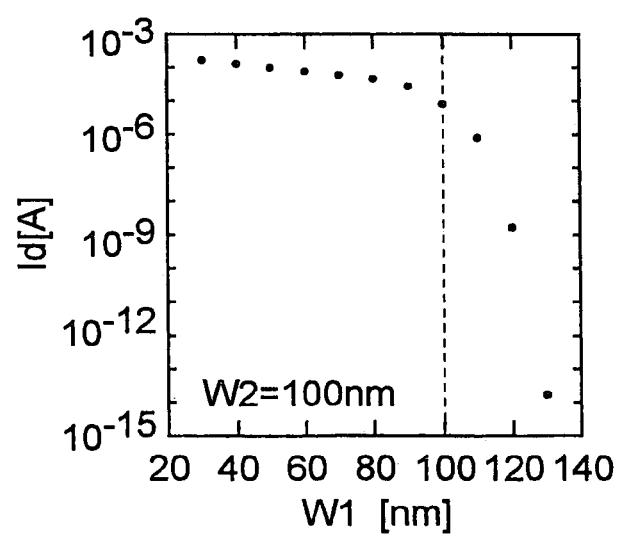
FIG. 11 is a graph showing the electrical characteristic of the memory element in the semiconductor storage device of the second embodiment.

FIG. 11 shows a drain current Id in the structure of FIG. 9 with the width W2 of the memory function body 1262 being fixed to 100 nm and the offset amount W1 being varied. Herein, the drain current is obtained by device simulation performed under the conditions that the memory function body 1262 is in erase state (positive holes are stored), and the diffusion layer regions 1212, 1213 are set to be a source electrode and a drain electrode, respectively. As shown in FIG. 11, with W1 being 100 nm or more (i.e., when the silicon nitride film 1242 and the diffusion layer region 1213 are not overlapped), the drain current shows rapid reduction. Since a drain current value is almost in proportion to a read operation speed, memory performance is rapidly deteriorated when W1 is 100 nm or more. In the range where the silicon nitride film 1242 and the diffusion layer region 1213 are overlapped, the drain current shows mild reduction. Therefore, taking a manufacturing dispersion into consideration, it is difficult to obtain a memory function unless at least part of the silicon nitride film 1242 that is a film having a function of holing electric charges is overlapped with the source/drain region.

Based on the above-described result of the device simulation, a memory cell array is manufactured with W2 being fixed to 100 nm, and W1 being set to 60 nm and 100 nm as design values. When W1 is 60 nm, the silicon nitride film 1242 is overlapped with the diffusion layer regions 1212, 1213 by 40 nm as a design value, and when W1 is 100 nm, there is no overlap as a design value. As a result of measuring read time of these memory cell arrays in comparison with the worst cases in consideration to dispersion, it was found out that the case where W1 was 60 nm as a design value was 100 times faster in readout access time. From a practical standpoint, it is preferable that the read access time is 100 nanoseconds or less per bit. It was found out, however, that this condition was never satisfied in the case of W1=W2. It was also found out that W2−W1>10 nm was more preferable in consideration to manufacturing dispersion.

It is preferable for reading information stored in the memory function body 1261 (region 1281) to set the diffusion layer region 1212 as a source electrode and the diffusion layer region 1213 as a drain region similar to the embodiment 1 and to form a pinchoff point on the side closer to the drain region in the channel region. More specifically, in reading information stored in either one of two memory function bodies, the pinch-off point is preferably formed in a region closer to the other memory function body in the channel region. This makes it possible to detect memory information in the memory function body 1261 with good sensitivity regardless of the storage condition of the memory function body 1262, resulting in large contribution to implementation of two-bit operation.

In the case of storing information only in one side out of the two memory function bodies, or in the case of using these two memory function bodies in the same storing condition, an pinch-off point is not necessarily formed in read operation.

Although not shown in FIG. 8, a well region (P type well in the case of N-channel device) is preferably formed on the surface of the semiconductor substrate 1211. Forming the well region facilitates control of other electric characteristics (withstand voltage, junction capacitance, and short channel effect) while maintaining impurity concentration of the channel region optimum for memory operation (rewrite operation and read operation).

Figure 12:
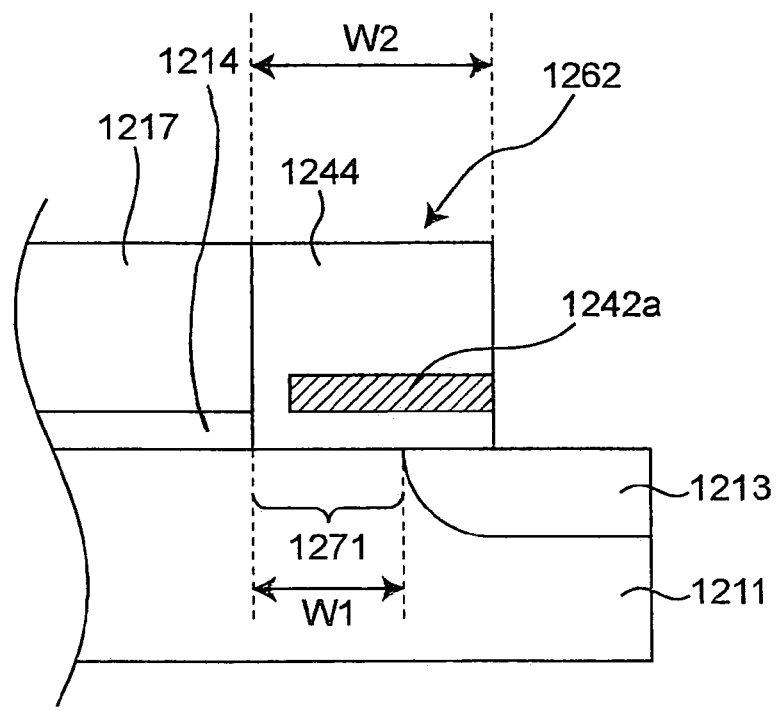
FIG. 12 is a schematic sectional view of the essential part of a memory element in the semiconductor storage device of the modified second embodiment of the present invention.

Also, it is preferable that the memory function body contains a charge holding film disposed approximately parallel to the surface of the gate insulating film. In other words, it is preferable that the surface of the charge holding film in the memory function body is disposed so as to have a constant distance from the surface of the gate insulating film. More particularly, as shown in FIG. 12, a silicon nitride film 1242a as an electric holding film in the memory function body 1262 has a face approximately parallel to the surface of the gate insulating film 1214. In other words, the silicon nitride film 1242a is preferably formed to have a uniform height from the height corresponding to the surface of the gate insulating film 1214.

The presence of the silicon nitride film 1242a approximately parallel to the surface of the gate insulating film 1214 in the memory function body 1262 makes it possible to effectively control easiness of formation of an inversion layer in the offset region 1271 with use of an amount of electric charges stored in the charge holding film 1242a, thereby enabling increase of memory effect. Also, by placing the silicon nitride film 1242a approximately parallel to the surface of the gate insulating film 1214, change of memory effect may be kept relatively small even with a dispersed offset amount (W1), enabling restraint of memory effect dispersion. In addition, movement of electric charges toward upper side of the silicon nitride film 1242a may be suppressed, and therefore characteristic change due to the movement of electric charges during memory holding may be restrained.

Furthermore, the memory function body 1262 preferably contains an insulating film (e.g., a portion of the silicon oxide film 1244 on the offset region 1271) that separates the silicon nitride film 1242a approximately parallel to the surface of the gate insulating film 1214 from the channel region (or the well region). This insulating film may restrain dispersion of the electric charges stored in the charge holding film, thereby contributing to obtaining a memory device with better holding characteristics.

It is noted that controlling the film thickness of the silicon nitride film 1242a as well as controlling the film thickness of the insulating film under the silicon nitride film 1242a (a portion of the silicon oxide film 1244 on the offset region 1271) to be constant make it possible to keep the distance from the surface of the semiconductor substrate to the electric charges stored in the charge holding film approximately constant. More particularly, the distance from the surface of the semiconductor substrate to the electric charges stored in the charge holding film may be controlled to be within the range from a minimum film thickness value of the insulating film under the silicon nitride 1242a to the sum of a maximum film thickness of the insulating film under the silicon nitride film 1242a and a maximum film thickness of the silicon nitride film 1242a. Consequently, the concentration of electric line of force generated by the electric charges stored in the silicon nitride film 1242a may be roughly controlled, and therefore dispersion of the degree of memory effect of the memory device may be minimized.

Third Embodiment

Figure 13:
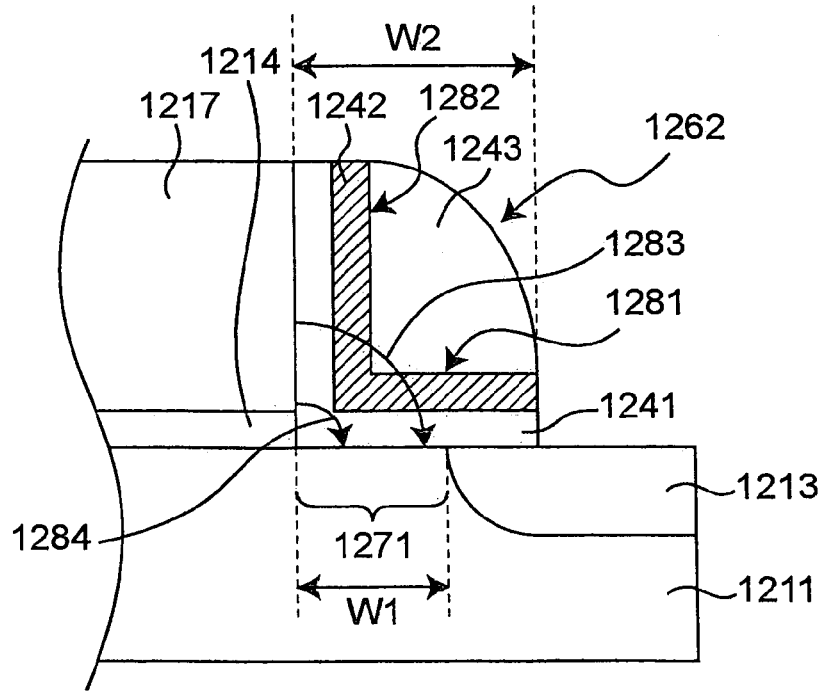
FIG. 13 is a schematic sectional view of the essential part of a memory element in the semiconductor storage device of the third embodiment of the present invention.

In this embodiment, a silicon nitride film 1242 as a film made of a first insulator in the charge holding portion 1262 has an approximately uniform film thickness as shown in FIG. 13. Further, the silicon nitride film 1242 as a charge holding film is configured such that a region 1281 having a constant thickness and disposed approximately parallel to the surface of the gate insulating film 1214 and a region 1282 extending in direction approximately parallel to the side face of the gate electrode 1217.

When a positive voltage is applied to the gate electrode 1217, electric line of force in the memory function body 1262 passes the silicon nitride film 1242 total two times through the first portion 1281 and the second portion 1282 as shown with an arrow 1283. It is noted that when a negative voltage is applied to the gate electrode 1217, the direction of electric line of force is reversed. Herein, a dielectric constant of the silicon nitride film 1242 is approx. 6, while a dielectric constant of silicon oxide films 1241, 1243 is approx. 4. Eventually, an effective dielectric constant of the memory function body 1262 in the direction of electric line of force (arrow 1283) becomes larger than that in the case where the charge holding film includes only the first portion 1281, which makes it possible to decrease potential difference between the both edges of the electric line of force. More specifically, much part of the voltage applied to the gate electrode 1217 is used to reinforce electric fields in the offset region 1271.

Electric charges are injected into the silicon nitride film 1242 in rewrite operation because generated electric charges are pulled by electric fields in the offset region 1271. As a consequence, the silicon nitride film 1242 including the second portion 1282 increases the electric charges injected into the memory function body 1262 in rewrite operation, thereby increasing a rewrite speed.

In the case where the portion of the silicon oxide film 1243 is a silicon nitride film, more specifically, in the case where the charge holding film is not flat against the height corresponding to the surface of the gate insulating film 1214, movement of electric charges toward upper side of the silicon nitride film becomes outstanding, and holding characteristics are deteriorated.

Instead of silicon nitride film, the charge holding film is more preferably formed from high-dielectric substances such as hafnium oxide having extremely large dielectric constant.

Further, the memory function body more preferably includes an insulating film (a portion of the s1241 on the silicon oxide film on the offset region 1271) that separates the charge holding film approximately parallel to the surface of the gate insulating film from the channel region (or the well region). This insulating film may restrain dispersion of the electric charges stored in the charge holding film, thereby enabling further improvement of holding characteristics.

Also, the memory function body more preferably includes an insulating film (a portion of the silicon oxide film 1241 in contact with the gate electrode 1217) that separates the gate electrode from the charge holding film extending in the direction approximately parallel to the side face of the gate electrode. This insulating film may prevent injection of electric charges from the gate electrode into the charge holding film and prevent change of electric characteristics, which may increase reliability of the memory device.

Further, similar to the second embodiment, it is preferable that the film thickness of the insulating film under the silicon nitride film 1242 (a portion of the silicon oxide film 1241 on the offset region 1271) is controlled to be constant, and further the film thickness of the insulating film disposed on the side face of the gate electrode (a portion of the silicon oxide film 1241 in contact with the gate electrode 1217) is controlled to be constant. Consequently, the concentration of electric line of force generated by the electric charges stored in the silicon nitride film 1242 may be roughly controlled, and leakage of electric charges may be prevented.

Fourth Embodiment

In this embodiment, optimization of the distance between a gate electrode, a memory function body, and a source/drain region is explained.

Figure 14:
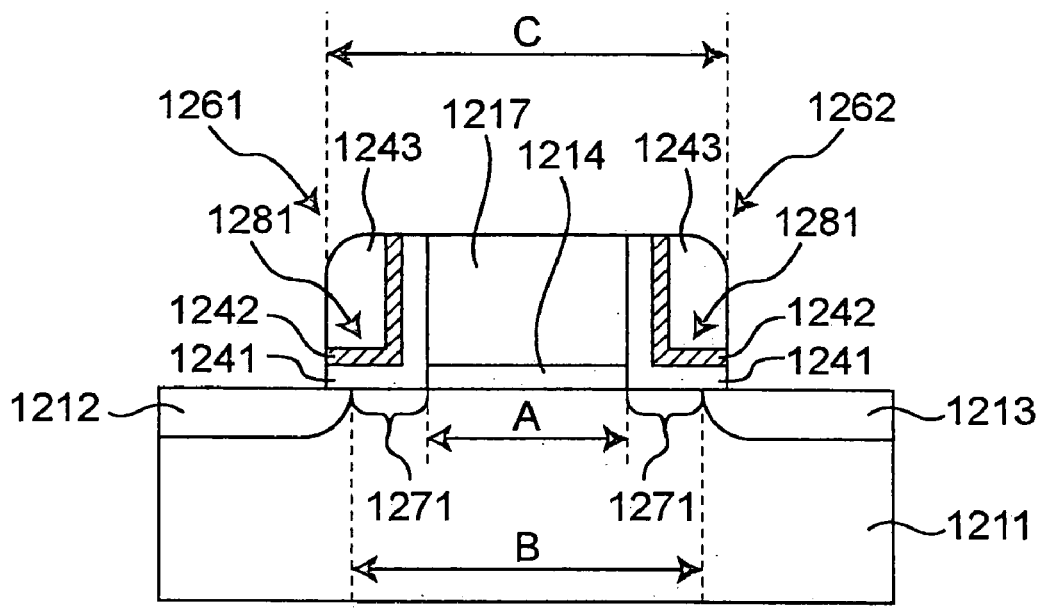
FIG. 14 is a schematic sectional view of the essential part of a memory element in the semiconductor storage device of the fourth embodiment of the present invention.

As shown in FIG. 14, reference symbol A denotes a gate electrode length in the cross section in channel length direction, reference symbol B denotes a distance (channel length) between source and drain regions, and reference symbol C denotes a distance from the edge of one memory function body to the edge of the other memory function body, more specifically a distance from the edge of a film (the side away from the gate electrode) having a function of holding the electric charges in one charge holding portion in the cross section in channel length direction to the edge of a film 1242 (the side away from the gate electrode 1217) having a function of holding the electric charges in the other memory function body 1262.

An equation A<B is preferable. When this equation is satisfied, in the channel region, there is present an offset region 1271 between a portion under the gate electrode 1217 and the source/drain regions 1212, 1213. Thereby, the electric charges stored in the memory function bodies 1261, 1262 (silicon nitride film 1242) effectively change easiness of inversion in the entire part of the offset region 1271. As a result, memory effect is increased, and high-speed read operation is particularly enabled.

Also, when the gate electrode 1217 and the source/drain regions 1212, 1213 are offset, that is when an equation A<B is satisfied, easiness of inversion of the offset region when a voltage is applied to the gate electrode 1217 is largely changed by an electric charge amount stored in the memory function bodies 1261, 1262. Consequently, memory effect increases and short channel effect can be reduced.

However, as long as the memory effect is effective, the offset region is not necessarily required. Even when the offset region 1271 is not present, if the impurity concentration in the source/drain regions 1212, 1213 is sufficiently small, the memory effect can still be effective in the memory function bodies 1261, 1262 (silicon nitride film 1242).

While, as described referring to FIG. 11, a memory function can not be obtained unless at least part of the silicon nitride film 1242a is overlapped with the source/drain region 1212, 1213. Consequently, the equation B<C is preferably satisfied. Therefore, the state of A<B<C is most preferable.

Fifth Embodiment

Figure 15:
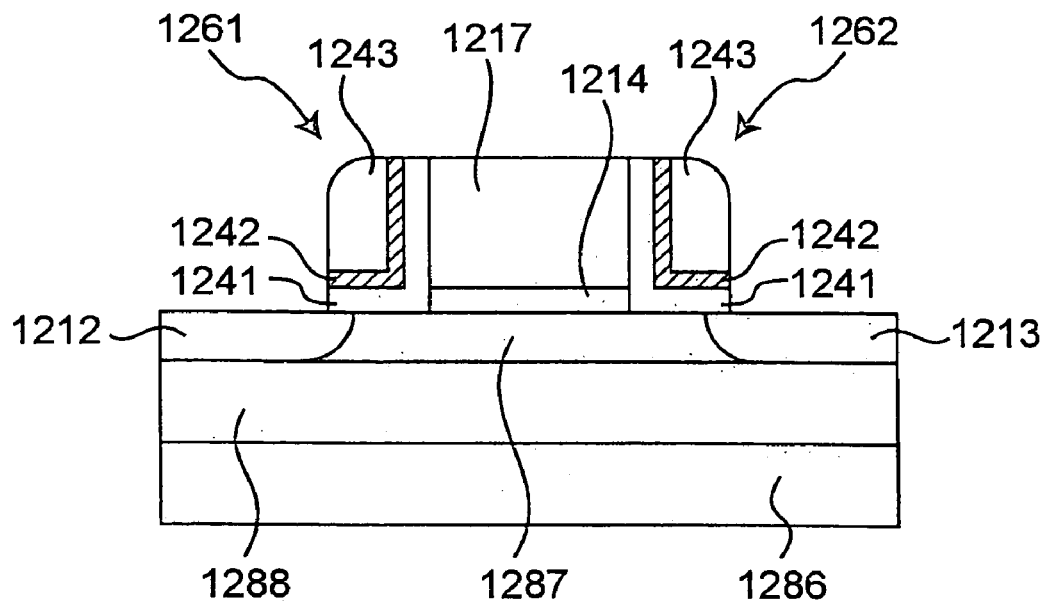
FIG. 15 is a schematic sectional view of the essential part of a memory element in the semiconductor storage device of the fifth embodiment of the present invention.

A memory device of semiconductor storage device according to this embodiment has essentially the same structure as that in the second embodiment except that the semiconductor substrate is SOI substrate as shown in FIG. 15.

The memory device is structured such that an embedded oxide film 1288 is formed on a semiconductor substrate 1286, and on top of the embedded oxide film 1288, SOI layer is further formed. In the SOI layer, there are formed diffusion regions 1212, 1213, and other areas constitute a body region 1287.

This memory device also brings about the functions and effects similar to those of the memory device in the second embodiment. Further, since the junction capacitance between the diffusion regions 1212, 1213 and the body region 1287 may be considerably reduced, it becomes possible to increase a device speed and to decrease power consumption.

Sixth Embodiment

Figure 16:
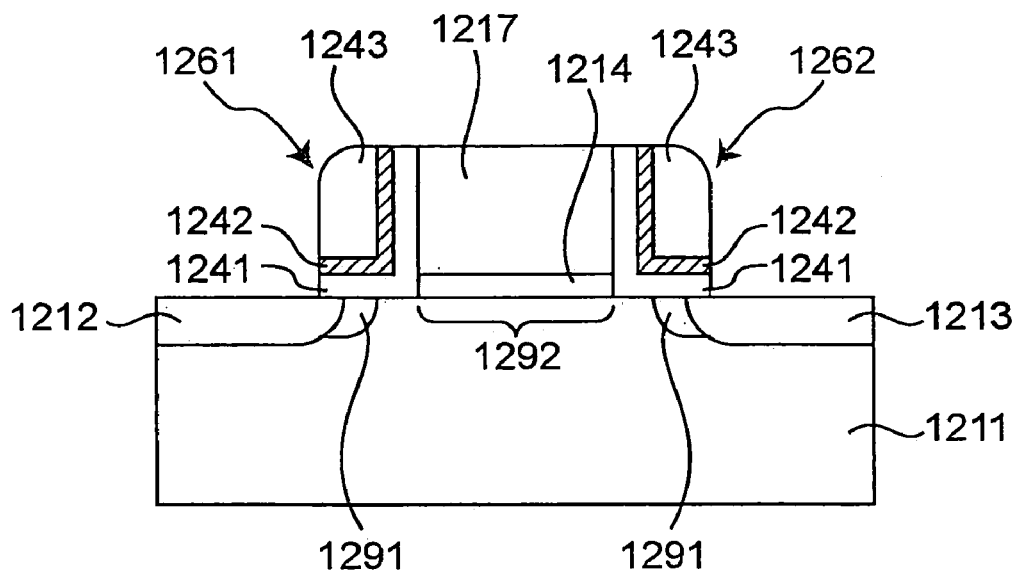
FIG. 16 is a schematic sectional view of the essential part of a memory element in the semiconductor storage device of the sixth embodiment of the present invention.

A memory device in this embodiment has essentially the same structure as that in the second embodiment except that in the vicinity of the channel side of N type diffusion regions 1212, 1213, a P type highly-concentrated region 1291 is added as shown in FIG. 16.

More specifically, the concentration of P type impurity (e.g., boron) in the P type highly-concentrated region 1291 is higher than the concentration of P type impurity in the region 1292. An appropriate value of the P type impurity concentration in the P type highly-concentrated region 1291 is, for example, around $5 \times 10^{17}$ to $1 \times 10^{19}$ cm$^{-3}$. Also, a value of the P type impurity concentration in the region 1292 may be set to, for example, $5 \times 10^{16}$ to $1 \times 10^{18}$ cm$^{-3}$.

Thus, providing the P type highly-concentrated region 1291 makes the junction between the diffusion regions 1212, 1213 and the semiconductor substrate 1211 steep right under the memory function bodies 1261, 1262. This facilitates generation of hot carriers in write and erase operation, thereby enabling reduction of voltage in write operation and erase operation or implementing high-speed write operation and erase operation. Further, since the impurity concentration in the region 1292 is relatively small, a threshold value when the memory is in erased state is small and so the drain current becomes large. Consequently, a read speed is increased. This makes it possible to provide a memory device having low rewrite voltage or a high rewrite speed, and having a high read speed.

Also in FIG. 16, by providing the P type highly-concentrated region 1291 in a position adjacent to the source/drain region and on the lower side of the memory function bodies 1261, 1262 (that is a position not right under the gate electrode), a threshold value of the entire transistor shows considerable increase. The degree of this increase is extremely larger than that in the case where the P type highly-concentrated region 1291 is right under the gate electrode. When write electric charges (electrons in the case where the transistor is N channel type) are stored in the memory function bodies 1261, 1262, the difference becomes larger. When enough erase electric charges (positive holes in the case where the transistor is N channel type) are stored in the memory function body, a threshold value of the entire transistor is decreased down to a value determined by the impurity concentration in the channel region (region 1292) under the gate electrode 1217. More specifically, the threshold value in the erased state is not dependent on the impurity concentration in the P type highly-concentrated region 1291, whereas the threshold value in the written state receives extremely large influence. Therefore, disposing the P type highly-concentrated region 1291 under the memory function bodies and adjacent to the source/drain region imparts extremely large fluctuation only to the threshold value in the written state, thereby enabling remarkable increase of memory effect (difference of threshold values in the erased state and the written state).

Seventh Embodiment

Figure 17:
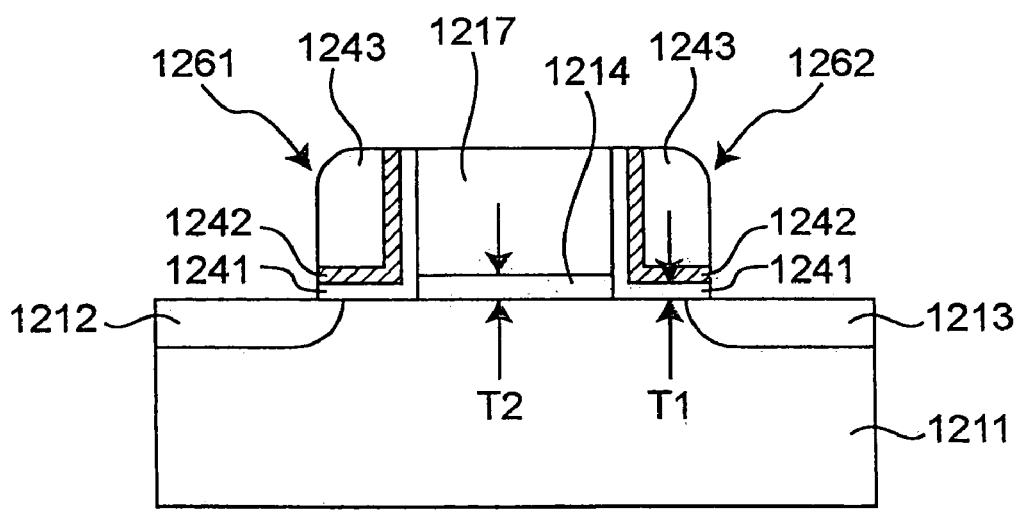
FIG. 17 is a schematic sectional view of the essential part of a memory element in the semiconductor storage device of the seventh embodiment of the present invention.

A memory body of a semiconductor storage device in this embodiment has essentially the same structure as that in the second embodiment except that the thickness T1 of the insulating film 1241 that separates the charge holding film (silicon nitride film 1242) from the channel region or the well region 1211 is smaller than the thickness T2 of the gate insulating film 1214 as shown in FIG. 17.

The gate insulating film 1214 has a lower limit of the thickness T2 because of the request for withstand voltage in memory rewrite operation. However, the thickness T1 of the insulating film 1241 can be smaller than T2 regardless of the request for withstand voltage.

In the memory device of the present embodiment, the thickness T1 of the insulating film has high design freedom as stated above because of the following reason.

In the memory device, the insulating film 1241 that separates the charge holding film (silicon nitride 1242) from the channel region or the well region is not interposed in between the gate electrode 1217 and the channel region or the well region. Consequently, the insulating film 1241 that separates the charge holding film (silicon nitride 1242) from the channel region or the well region does not receive direct influence from the high-electric fields that affect in between the gate electrode 1217 and the channel region or the well region, but receives influence from relatively weak electric fields expanding from the gate electrode 1217 in lateral direction. As a result, despite the request for withstand voltage to the gate insulating film 1214, it becomes possible to make T1 smaller than T2. Decreasing the thickness T1 of the insulating film facilitates injection of electric charges into the memory function bodies 1261, 1262, decreases voltage for write operation and erase operation, or enables high-speed write operation and erase operation. In addition, since an electric charge amount induced in the channel region or the well region increases when electric charges are stored in the silicon nitride film 1242, increased memory effect may be implemented.

Some electric lines of force having short length in the memory function body do not pass the silicon nitride film 1242 as shown with an arrow 1284 in FIG. 13. Since electric field strength is relatively large on such a short electric line of force, the electric fields along the electric line of force plays an important role in rewrite operation. By decreasing the thickness T1 of the insulating film 1241, the silicon nitride film 1242 moves to the lower side of the FIG. 13, so that the electric line of force shown with the arrow 1284 passes the silicon nitride film 1242. As a consequence, an effective dielectric constant in the memory function body along the electric line of force 1284 in the direction of arrow 1284 becomes large, which makes it possible to make potential difference between the both ends of the electric line of force 1284 smaller. Therefore, most part of voltage applied to the gate electrode 1217 is used to strengthen the electric fields in the offset region, thereby implementing high-speed write operation and erase operation.

Contrary to this, for example in EEPROM as typified by flash memory, an insulating film that separates a floating gate from the channel region or the well region is interposed in between a gate electrode (control gate) and the channel region or the well region, so that the insulating film receives direct influence from high electric fields of the gate electrode. In EEPROM, therefore, the thickness of the insulating film that separates the floating gate from the channel region or the well region is limited, which hinders optimization of the functions of a memory device.

As is clear from the above, by setting the thickness T1 of the insulating film 1241 and the thickness T2 of the gate insulating film 1214 as T1<T2, it becomes possible to decrease voltage in write operation and erase operation or implement high-speed write operation and erase operation, and to enable further increase of memory effect without degrading withstand voltage capability of the memory. It is noted that the thickness T1 of the insulating film is preferably 0.8 nm or more, that is the limit range in which uniformity in manufacturing process or certain level of film quality may be maintained and holding characteristics do not suffer extreme deterioration.

More specifically, in the case of liquid crystal driver LSI which has a severe design rule and requires high withstand voltage, maximum 15 to 18V voltage is necessary for driving liquid crystal panel TFT (Thin Film Transistor). Eventually, it is not possible to make the gate oxide film thinner. In the case of mounting a nonvolatile memory of the present invention as an image adjuster together with other devices on the liquid crystal driver LSI, the memory device of the present invention enables optimum design of the thickness of the insulating film that separates the charge holding film (silicon nitride film 1242) from the channel region or the well region independently of the thickness of the gate insulating film. For example, in a memory cell with a gate electrode length (word line width) of 250 nm, there may be separately set like T1=20 nm and T2=10 nm, fulfilling a memory cell with good write efficiency. (Short channel effect is not generated even though T1 is larger than that of normal logic transistors, because the source/drain region is offset from the gate electrode.)

Eighth Embodiment

Figure 18:
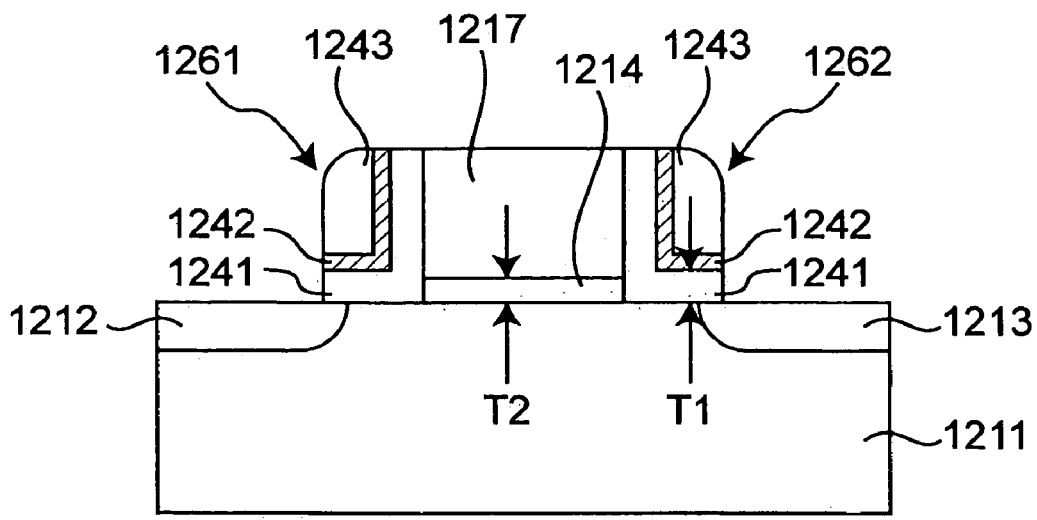
FIG. 18 is a schematic sectional view of the essential part of a memory element in the semiconductor storage device of the eighth embodiment of the present invention.

A memory device of a semiconductor storage device according to this embodiment has essentially the same structure as that in the second embodiment except that the thickness (T1) of the insulating film that separates the charge holding film (silicon nitride film 1242) from the channel region or the well region is larger than the thickness (T2) of the gate insulating film as shown in FIG. 18.

The gate insulating film 1214 has an upper limit of the thickness T2 because of the request for prevention of short channel effect of the device. However, the thickness T1 of the insulating film 1241 can be larger than T2 regardless of the request for prevention of short channel effect. More specifically, as miniaturization scaling proceeds (thinning of the gate insulating film proceeds), the thickness of the insulating film that separates the charge holding film (silicon nitride film 1242) from the channel region or the well region may be optimally designed independently of the thickness T2 of the gate insulating film, which implements the effect that the memory function body will not disturb scaling.

In the memory device of the present embodiment, the thickness T1 of the insulating film has high design freedom as stated above because, as is already described, the insulating film that separates the charge holding film from the channel region or the well region is not interposed in between the gate electrode and the channel region or the well region. As a result, despite the request for prevention of short channel effect to the gate insulating film, it becomes possible to make T1 larger than T2.

Increasing the thickness of the insulating film makes it possible to prevent dispersion of the electric charges stored in the memory function body and to improve holing characteristics of the memory.

Therefore, setting as T1>T2 enables improvement of holding characteristics without deteriorating short channel effect of the memory.

It is noted that the thickness T1 of the insulating film is preferably 20 nm or less in consideration of reduction of a rewrite speed.

More specifically, a conventional nonvolatile memory as typified by flash memory is structured such that a selection gate electrode constitutes a write/erase gate electrode, and a gate insulating film (including a floating gate) corresponding to the write/erase gate electrode serves also as an electric charge storage film. Consequently, since the request for miniaturization (creation of thinner devices is essential for restraining short channel effect) conflicts the request for securing reliability (in order to control leakage of stored electric charges, the thickness of an insulating film that separates a floating gate from the channel region or the well region cannot be decreased to smaller than approx. 7 nm), miniaturization of the device is difficult. In fact, according to ITRS (International Technology Roadmap for Semiconductors), miniaturization of a physical gate length down to approx. 0.2 micron or lower is not yet in sight. In the memory device of the present invention, independent designing of T1 and T2 is available as described above, and therefore miniaturization becomes possible.

In the present invention, for example, in a memory cell with a gate electrode length (word line width) of 450 nm, there is separately set like T2=4 nm and T1=7 nm, fulfilling a semiconductor storage device free from generation of short channel effect. Short channel effect is not generated even though T2 is set larger than that of normal logic transistors, because the source/drain region is offset from the gate electrode.

Also, since the source/drain region is offset from the gate electrode in the memory device of the present invention, miniaturization is further facilitated compared to normal logic transistors.

As described above, since an electrode for supporting write and erase operation is not present above the memory function body, the insulating film that separates the charge holding film from the channel region or the well region does not directly receive the influence of high electric fields that affect in between the electrode that supports write and erase operation and the channel region or the well region, but receives influence only from relatively weak electric fields expanding from the gate electrode in lateral direction. This makes it possible to fulfill a memory cell having the gate length miniaturized more than the gate length of the logic transistors in the same processing generation.

Ninth Embodiment

This embodiment relates to changes of electric characteristics when rewrite operation is performed in the memory device of the semiconductor storage device according to the present invention.

Figure 19:
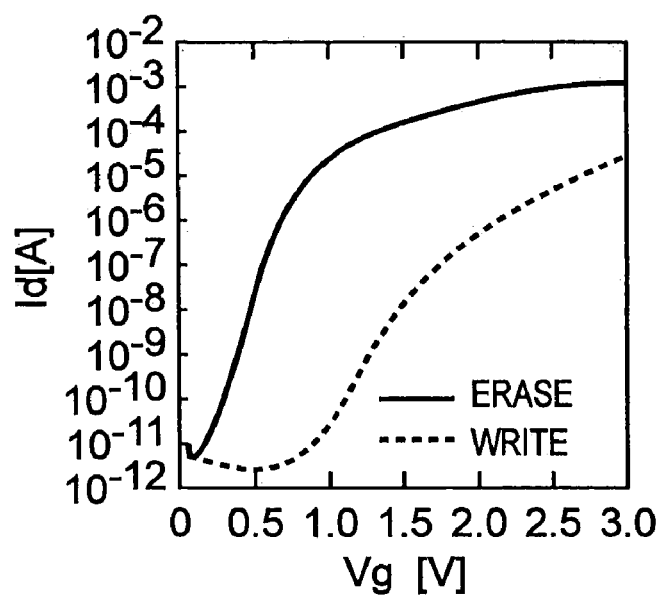
FIG. 19 is a graph showing the electrical characteristic of the memory element in the semiconductor storage device of the ninth embodiment.

FIG. 19 is a view showing characteristic curves of a drain current (Id) versus a gate voltage (Vg) (measured values) where an electric charge amount in the memory function body of an N-channel type memory device varies between erase state and written state.

Figure 29:
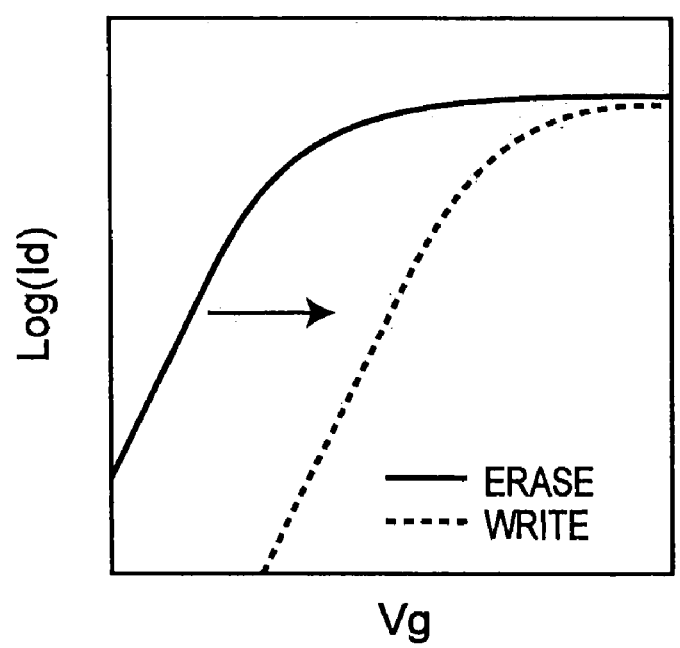
FIG. 29 is a graph showing the electrical characteristic of the conventional flash memory.

As clearly shown in FIG. 19, when write operation is performed in the erased state (a solid line), as shown by a broken line, not only the threshold value simply rises, but inclination of the graph dramatically falls especially in sub-threshold region. Therefore, even in the region with relatively high gate voltage (Vg), a drain current ratio of the erased state to the written state is large. For example in the point of Vg=2.5V, the current ratio is still two digits or more. This characteristic is largely different from that in the case of a flash memory shown in FIG. 29.

The appearance of the above characteristic in the memory device is a phenomenon peculiar to the case where the gate electrode and the diffusion region are offset and therefore the gate electric fields are difficult to reach the offset region. When the memory device is in the written state, an inversion layer is extremely difficult to be generated in the offset region below the memory function body even if a positive voltage is applied to the gate electrode. This causes smaller inclination of the Id-Vg curve line in the sub-threshold region in the written state.

When the memory device is in the erased state, high-density electrons are induced in the offset region. Further, when 0V is applied to the gate electrode (i.e., in OFF state), electrons are not induced in the channel below the gate electrode (and therefore an off current is small). This causes large differential coefficient of the Id-Vg curve line in the sub-threshold region in the erased state and a large increase rate of current (conductance) even in the voltage region over the threshold.

As is clear from the above description, the memory device of the semiconductor storage device according to the present invention makes it possible to make the drain current ratio of the erased state to the written state particularly large.

Tenth Embodiment

In this tenth embodiment, a semiconductor storage device provided with a memory cell array in which the memory elements of the first through eighth embodiments are employed as memory cells will be described.

Figure 20:
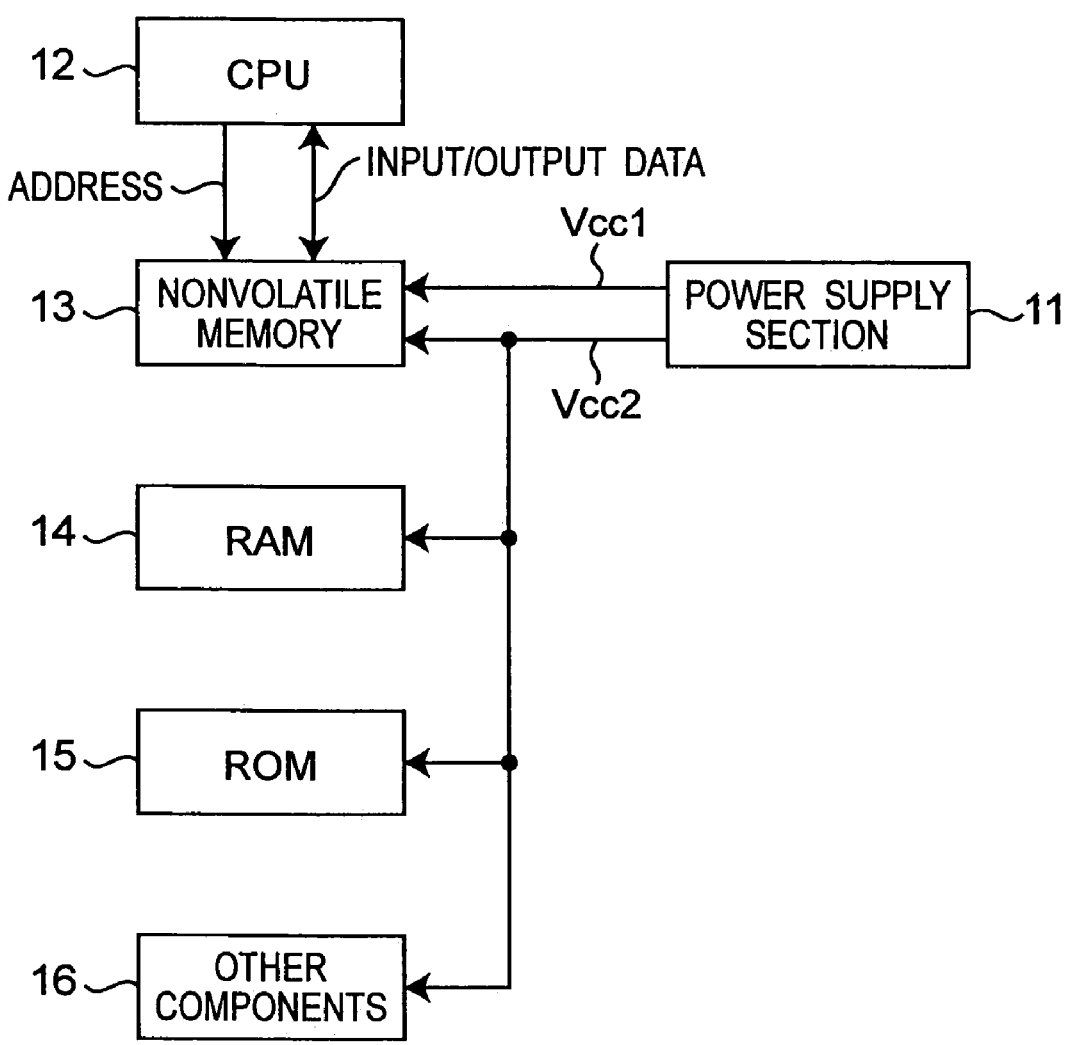
FIG. 20 is a block diagram of a system that includes a nonvolatile memory employing the memory element of the tenth embodiment of the present invention.

FIG. 20 shows a block diagram of a system of the tenth embodiment of the present invention including a nonvolatile memory that employs the memory element.

The system shown in FIG. 20 includes a power supply section 11, a CPU (Central Processing Unit) 12, a nonvolatile memory 13, a RAM (Random Access Memory) 14, a ROM (Read-Only Memory) 15 and other components 16. The power supply section 11 outputs a first power voltage VCC1 and a second power voltage VCC2. The first power voltage VCC1 and the second power voltage VCC2 are supplied from the power supply section 11 to the nonvolatile memory 13, and the second power voltage VCC2 is supplied from the power supply section 11 to the RAM, the ROM15 and the other components 16.

Figure 21:
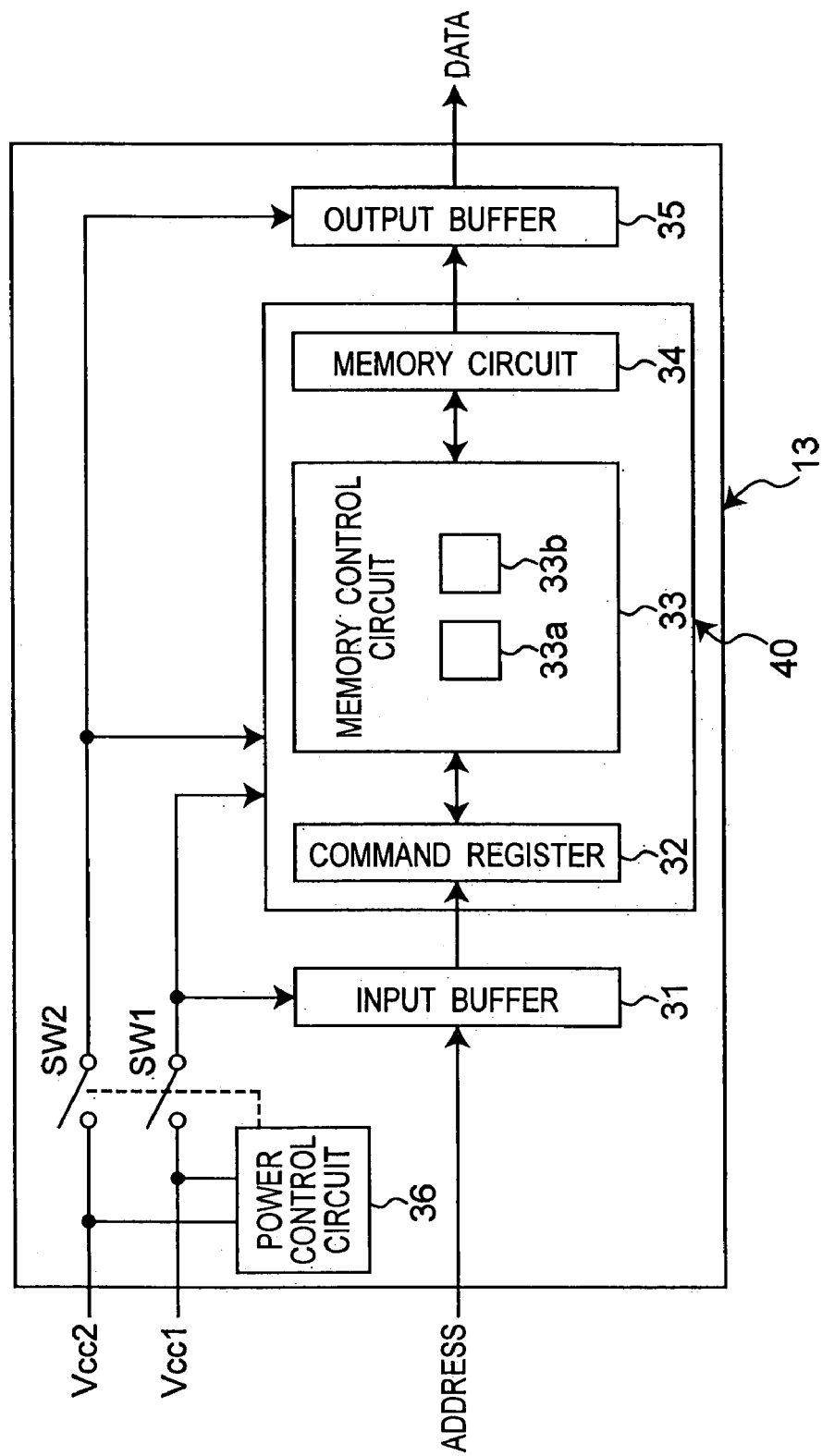
FIG. 21 is a block diagram of the nonvolatile memory shown in FIG. 20.

Moreover, FIG. 21 shows a block diagram of the non-volatile memory 13 shown in FIG. 20. As shown in FIG. 21, this nonvolatile memory 13 includes an input buffer 31 to which an address signal is inputted, a command register 32 that receives a signal from the input buffer 31, a memory control circuit 33 that receives a command from the command register 32 and controls the rewrite operation and so on, a memory circuit 34 that includes a memory cell array in which rewrite and so on are executed by the memory control circuit 33, and an output buffer 35 as one example of an output circuit that receives a signal from the memory circuit 34 and outputs data. The command register 32, the memory control circuit 33 and the memory circuit 34 constitute a memory core circuit 40. Moreover, the memory control circuit 33 has a rewrite control section 33a and a lockout circuit 33b.

The first power voltage VCC1 is supplied to the input buffer 31 and the memory core circuit 40 via a switch SW1 as one example of a power supply switch, and the second power voltage VCC2 is supplied to the memory core circuit 40 and the output buffer 35 via the switch SW2 as one example of the power supply switch. The nonvolatile memory 13 includes a power control circuit 36 that controls the turning-on-and-off of the switches SW1 and SW2 on the basis of the first power voltage VCC1 and the second power voltage VCC2.

Moreover, Table 1 shows concrete examples of the power voltages supplied to the nonvolatile memory of the first embodiment of the present invention.

TABLE 1

| Voltage Type | VCC1 | VCC2 |
|---|---|---|
| Type A | 3.0 V | 1.8 V |
| Type B | 3.0 V | 3.0 V |

As shown in Table 1, in the case of the type A whose voltage type is a 1.8-V system, the first power voltage VCC1 supplied to the input buffer 31 and the memory core circuit 40 is set at 3.0 V, and the second power voltage VCC2 supplied to the output buffer 35 is set at 1.8 V. Moreover, in the case of the type B whose voltage type is a 3.0-V system, the first power voltage VCC1 supplied to the input buffer 31 and the memory core circuit 40 is set at 3.0 V, and the second power voltage VCC2 supplied to the output buffer 35 is set at 3.0 V. The output buffer 35 is an input/output buffer that also plays the role of an input buffer in a general memory, and the directions of signals to and from the memory circuit 34 are also bidirectional. There are practically supplied not only the second power voltage VCC2 but also the first power voltage VCC1.

In general, the power voltages supplied to the logic circuit have been reduced as the gate length of the transistor has been shortened in accordance with the progress of the fine processing technology. The optimum values of the power voltages of the first power voltage VCC1 and the second power voltage VCC2 supplied to the semiconductor storage device of the invention of the present application are also changed according to gate length of the transistor and not limited to the values shown in Table 1.

Figure 22:
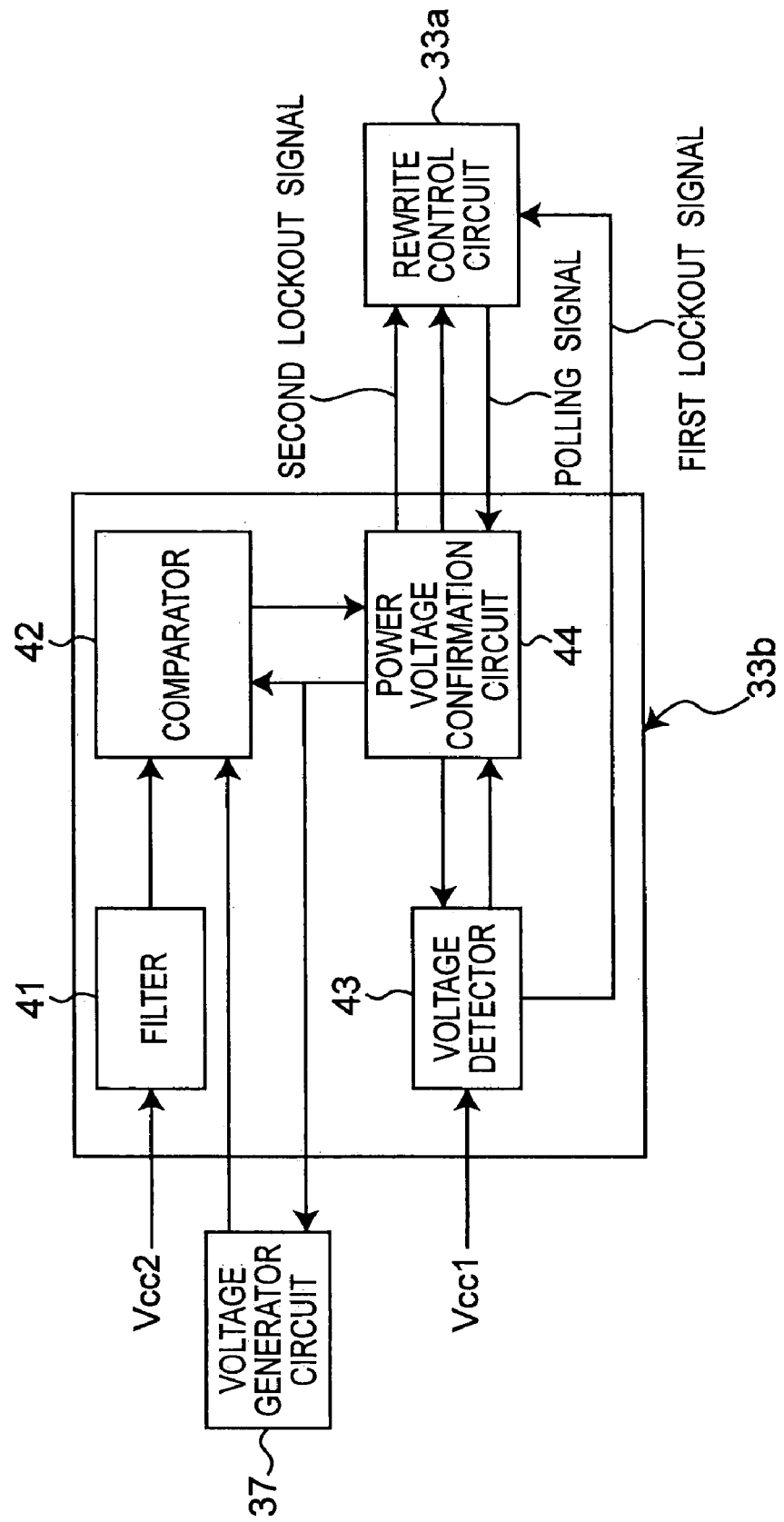
FIG. 22 is a block diagram of a lockout circuit of the above nonvolatile memory.

FIG. 22 shows a block diagram of the lockout circuit 33b of the aforementioned nonvolatile memory. As shown in FIG. 22, this lockout circuit 33b has a voltage detector 43 for detecting the voltage level of the first power voltage VCC1, a filter 41 for removing noises from the second power voltage VCC2, a comparator 42 for comparing the second power voltage VCC2 inputted via the filter 41 with a voltage level V2 that serves as a second prescribed voltage from a voltage generator circuit 37, and a power voltage confirmation circuit 44 for executing lockout control based on a signal from the voltage detector 43 and a signal from the comparator 42.

The lockout circuit 33b prevents the occurrence of data error in the memory circuit 34 by monitoring the first power voltage VCC1 and the second power voltage VCC2.

When the first power voltage VCC1 is lower than a reference voltage in case of powering on, i.e., at the rise time of the first power voltage VCC1 and the second power voltage VCC2, a first lockout signal is outputted from the voltage detector 43. Upon receiving the first lockout signal, the rewrite control circuit 33a enters a lockout state to inhibit a false rewrite command at the rise time of the power voltage and put protection into effect.

When the second power voltage VCC2 is lower than the voltage level V2 as the second prescribed voltage, a second lockout signal is outputted from the power voltage confirmation circuit 44. Upon receiving the second lockout signal, the rewrite control section 33*a* enters the lockout state to put protection into effect against the false rewrite command at the rise time of the power voltage.

Moreover, when at least one voltage level of the first power voltage VCC1 and the second power voltage VCC2 cannot be maintained after the power is turned on, the false rewrite command is inhibited to effect protection.

When neither one of the first and second lockout signals is outputted and the rewrite command is received, the rewrite control circuit 33*a* outputs a polling signal to the power voltage confirmation circuit 44. According to the polling signal, the power voltage confirmation circuit 44 outputs a signal that represents the voltage levels of the first power voltage VCC1 and the second power voltage VCC2 to the rewrite control circuit 33*a*. Then, on the basis of the signals, the rewrite control circuit 33*a* determines whether or not to inhibit the rewrite command.

Figure 23:
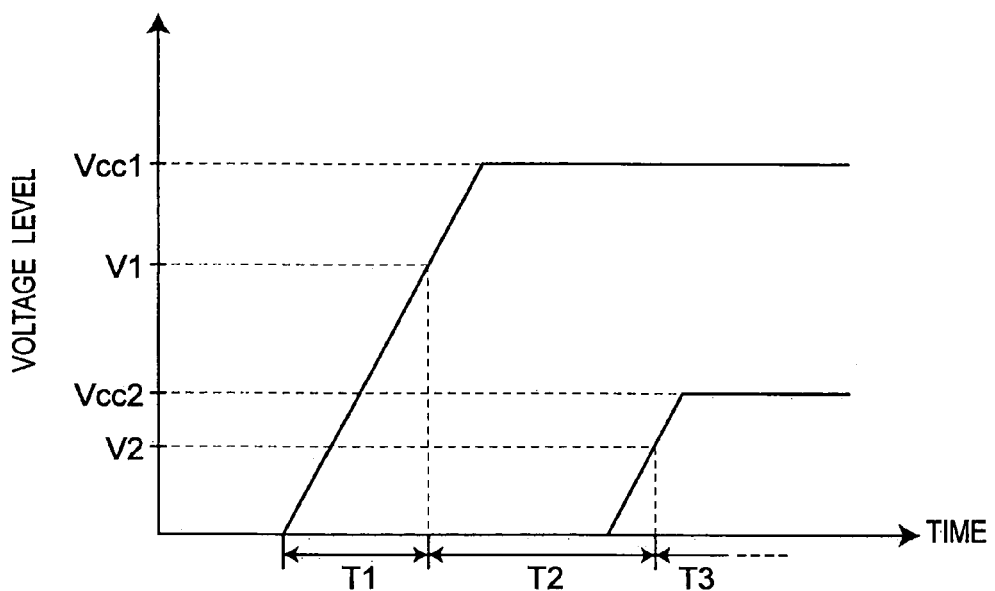
FIG. 23 is a graph showing a timewise change of the power voltages VCC1 and VCC2 of the above nonvolatile memory.

FIG. 23 shows the timewise change of the power voltages VCC1 and VCC2 of the nonvolatile memory when the power is turned on. In FIG. 23, the period T1 is the period during which the first power voltage VCC1 is lower than the voltage level V1 that serves as the first prescribed voltage, and the period T2 is the period during which the first power voltage VCC1 is higher than the voltage level V1 and the second power voltage VCC2 is lower than the voltage level V2 that serves as the second prescribed voltage. Moreover, the period T3 is the period during which the first power voltage VCC1 is higher than the voltage level V1 and the second power voltage VCC2 is higher than the voltage level V2. The voltage level V1 is about 2.0 V, and the voltage level V2 is about 1.2 V.

During the period T1, the first lockout signal is outputted from the voltage detector circuit 43, and the second lockout signal is outputted from the power voltage confirmation circuit 44. Therefore, the rewrite control circuit 33*a* inhibits the rewrite command to the memory circuit 34 (shown in FIG. 21).

Next, during the period T2, the first lockout signal is not outputted from the voltage detector circuit 43, but the second lockout signal is outputted from the power voltage confirmation circuit 44. Therefore, the rewrite control circuit 33*a* inhibits the rewrite command to the memory circuit 34 (shown in FIG. 21).

During the period T3, the first lockout signal is not outputted from the voltage detector circuit 43, and the second lockout signal is not outputted from the power voltage confirmation circuit 44. Therefore, the rewrite control circuit 33*a* inhibits the rewrite command to the memory circuit 34 (shown in FIG. 21).

Figure 24:
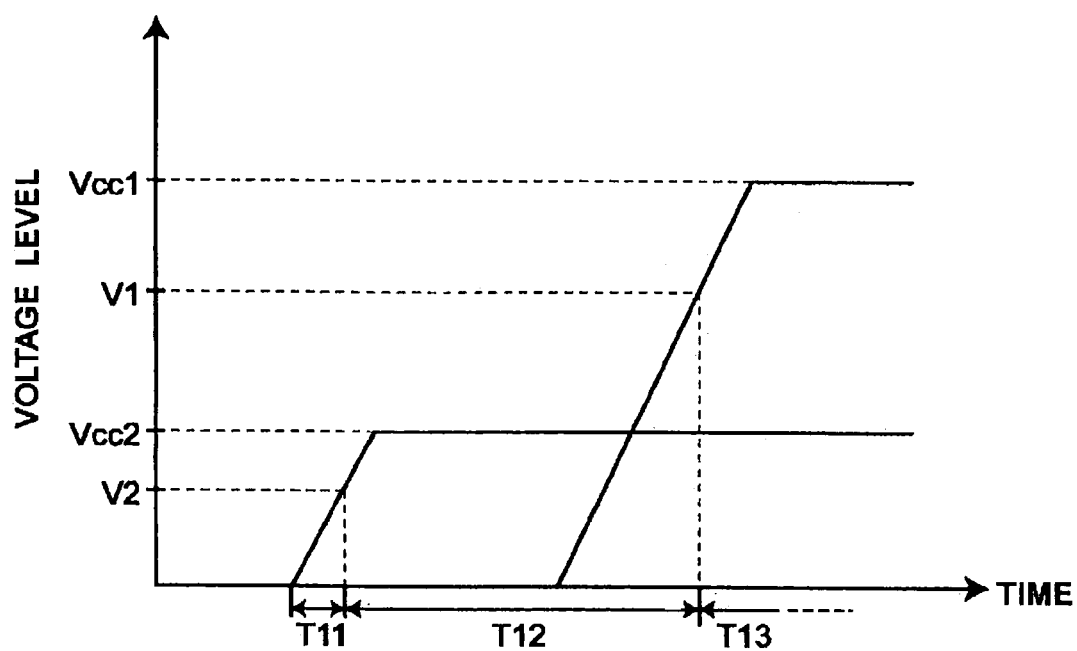
FIG. 24 is a graph showing the timewise change of the power voltages VCC1 and VCC2 of the above nonvolatile memory.

Next, FIG. 24 shows the timewise change of the power voltages VCC1 and VCC2 of the nonvolatile memory at the rise time of the power voltage. In FIG. 24, the period T11 is the period during which the second power voltage VCC2 is lower than the voltage level V2, and the period T12 is the period during which the second power voltage VCC2 is higher than the voltage level V2 and the first power voltage VCC1 is lower than the voltage level V1. Moreover, the period T13 is the period during which the second power voltage VCC2 is higher than the voltage level V2, and the first power voltage VCC1 is higher than the voltage level V1. The voltage level V1 is about 2.0 V, and the voltage level V2 is about 1.2 V.

During the period T11, the first lockout signal is outputted from the voltage detector circuit 43, and the second lockout signal is outputted from the power voltage confirmation circuit 44. Therefore, the rewrite control circuit 33*a* inhibits the rewrite command to the memory circuit 34 (shown in FIG. 21).

Next, during the period T12, the second lockout signal is not outputted from the power voltage confirmation circuit 44, but the first lockout signal is outputted from the voltage detector circuit 43. Therefore, the rewrite control circuit 33*a* inhibits the rewrite command to the memory circuit 34 (shown in FIG. 21).

During the period T13, the first lockout signal is not outputted from the voltage detector circuit 43, and the second lockout signal is not outputted from the power voltage confirmation circuit 44. Therefore, the rewrite control circuit 33*a* inhibits the rewrite command to the memory circuit 34 (shown in FIG. 21).

Figure 25:
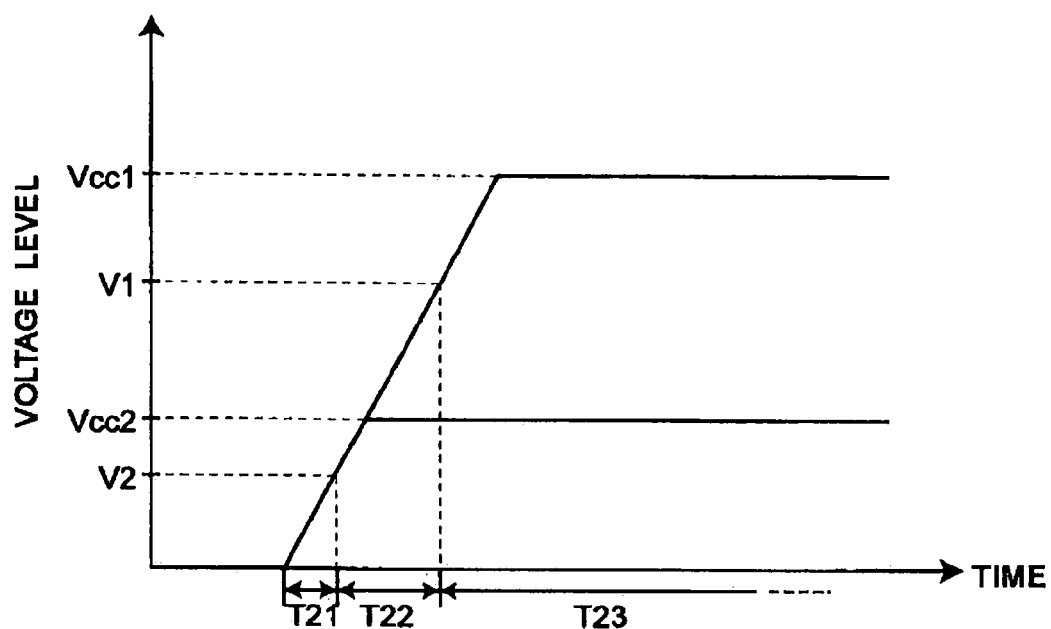
FIG. 25 is a graph showing the timewise change of the power voltages VCC1 and VCC2 of the above nonvolatile memory.

Furthermore, FIG. 25 shows the timewise change when the power voltages VCC1 and VCC2 of the nonvolatile memory simultaneously rise.

As shown in FIG. 25, the period T21 is the period during which the first power voltage VCC1 is lower than the voltage level V1, and the second power voltage VCC2 is lower than the voltage level V2. The period T22 is the period during which the second power voltage VCC2 is higher than the voltage level V2, and the first power voltage VCC1 is lower than the voltage level V1. Moreover, the period T23 is the period during which the second power voltage VCC2 is higher than the voltage level V2, and the first power voltage VCC1 is higher than the voltage level V1. The voltage level V1 is about 2.0 V, and the voltage level V2 is about 1.2 V.

During the period T21, the first lockout signal is outputted from the voltage detector circuit 43, and the second lockout signal is outputted from the power voltage confirmation circuit 44. Therefore, the rewrite control circuit 33*a* inhibits the rewrite command to the memory circuit 34 (shown in FIG. 21).

Next, during the period T22, the second lockout signal is not outputted from the power voltage confirmation circuit 44, but the first lockout signal is outputted from the voltage detector circuit 43. Therefore, the rewrite control circuit 33*a* inhibits the rewrite command to the memory circuit 34 (shown in FIG. 21).

During the period T23, the first lockout signal is not outputted from the voltage detector circuit 43, and the second lockout signal is not outputted from the power voltage confirmation circuit 44. Therefore, the rewrite control circuit 33*a* inhibits the rewrite command to the memory circuit 34 (shown in FIG. 21).

As described above, in the tenth embodiment, the storage retention of two bits per memory element and stable operation can be achieved even if the device is miniaturized, and the occurrence of the malfunction of rewrite error and so on attributed to the reduction in the level of the power voltage supplied to the memory circuit 34 including the memory cell array can be prevented.

Moreover, the supply state of the power voltage of the voltage detector circuit 43 is controlled by the first power voltage VCC1. That is, when the first power voltage VCC1 becomes equal to or higher than the prescribed voltage, the power consumption can be reduced by putting the voltage detector circuit 43 into the OFF state.

Moreover, the supply states of the power voltages to the comparator 42 and the voltage generator circuit 37 are controlled by the second power voltage VCC2. That is, when the second power voltage VCC2 becomes equal to or higher than the prescribed voltage, the comparator 42 and the voltage generator circuit 37 are put into the OFF state, and this allows the power consumption to be reduced.

By sending a preset signal from the voltage detector circuit 43 to the power voltage confirmation circuit 44 when the first power voltage VCC1 is lower than the voltage level V1 that serves as the first prescribed voltage, the preset power voltage confirmation circuit 44 can rapidly make a determination of the second power voltage VCC2 particularly when the power voltage rises by putting the comparator 42 and the voltage generator circuit 37 into the ON state regardless of the state of the second power voltage VCC2.

Moreover, by turning on the switches SW1 and SW2 to supply the first and second power voltages VCC1 and VCC2 when the memory circuit 34 is in the active state and turning off the switches SW1 and SW2 to stop the supply of the first and second power voltages VCC1 and VCC2 when the memory circuit is in the standby state, the power consumption attributed to a leak current in the standby state can be reduced. Furthermore, by inhibiting the command to the memory circuit 34 when the switches SW1 and SW2 are in the OFF state and the supply of the power voltage is stopped, the occurrence of a malfunction can be more reliably prevented.

For example, when the voltage detector circuit 43 and the power voltage confirmation circuit 44 make an erroneous determination due to the power voltage in the active state and the memory circuit 34 is supplied with the rewrite command and enters the operation thereof regardless of the fact that the supply of the power voltage is stopped when this nonvolatile memory shifts from the active state into the standby state, the occurrence of a malfunction can be prevented by the stop of the supply of the power voltage.

Although only the rewrite command to the memory circuit 34 is inhibited in the tenth embodiment, it is acceptable to similarly inhibit not only the rewrite command but also other commands such as a read command.

Moreover, by inhibiting the command to the memory circuit 34 by outputting the first lockout signal for inhibiting the command from the voltage detector circuit 43 to the memory circuit 34 when the first power voltage VCC1 supplied to the memory circuit 34 is outside a predetermined range, the first lockout signal can be rapidly transmitted to the memory circuit 34 regardless of the state of the power voltage confirmation circuit 44, and the occurrence of a malfunction attributed to the delay of the transmission of the first lockout signal is prevented.

Eleventh Embodiment

Figure 26:
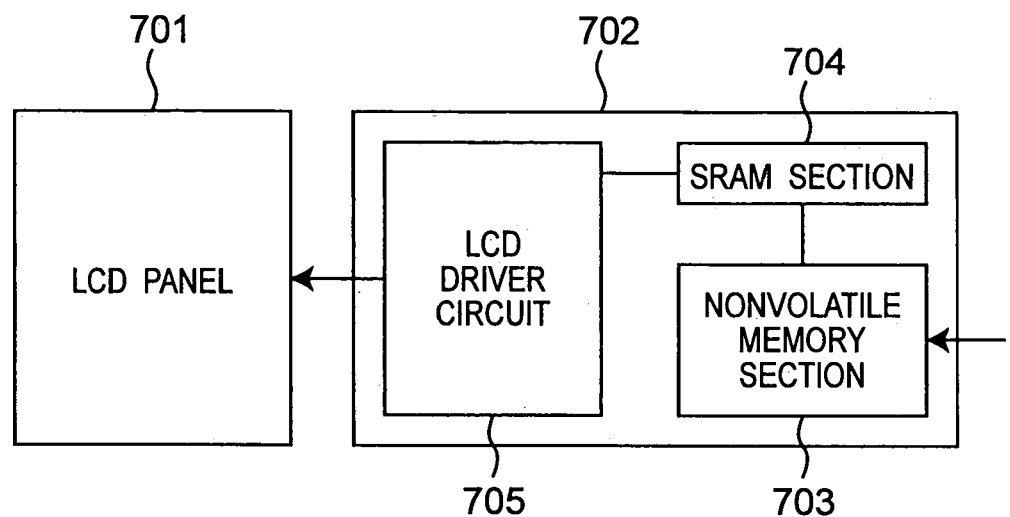
FIG. 26 is a schematic structural view of a liquid crystal display of the eleventh embodiment into which the semiconductor storage device of the present invention is incorporated.

As an application example of the aforementioned semiconductor storage device, there can be enumerated, for example, a rewritable nonvolatile memory for the image adjustment of an LCD panel as shown in FIG. 26.

The LCD panel 701 shown in FIG. 26 is driven by an LCD driver 702. Inside the LCD driver 702, there exist a nonvolatile memory section 703 as a semiconductor storage device, an SRAM section 704 and an LCD driver circuit 705. The nonvolatile memory section 703 includes the nonvolatile memory element of the present invention preferably constructed of the semiconductor storage device of the tenth embodiment. The nonvolatile memory section 703 has an externally rewritable construction.

The information stored in the nonvolatile memory section 703 is transferred to the SRAM section 704 when the power supply of the equipment is turned on. The LCD driver circuit 705 can read the storage information from the SRAM section 704 at need. By providing the SRAM section, the storage information can be read with very high speed.

The LCD driver 702 may either be externally attached to the LCD panel 701 as shown in FIG. 26 or formed on the LCD panel 701.

The LCD panel changes the gradation displayed by giving multi-step voltages to the pixels, where the relation between the given voltage and the displayed gradation has a variation depending on each product. Therefore, by storing information for correcting the variations of individual products after the completion of each product and executing correction based on the information, the image qualities of products can be uniformed. Therefore, it is preferable to mount the rewritable nonvolatile memory for storing the correction information on the LCD driver. It is preferable to employ the nonvolatile memory element of the present invention as this nonvolatile memory and particularly preferable to employ the semiconductor storage device described in connection with the tenth embodiment in which the nonvolatile memory elements of the present invention are integrated.

If the memory element of the present invention is employed as the nonvolatile memory for adjusting the image of the LCD panel, the manufacturing cost can be reduced since the process of consolidation with the circuits of the LCD driver and so on is easy. Moreover, the semiconductor storage devices described in connection with the tenth embodiment have a comparatively small memory scale and are particularly suitable for the case where reliability and stability are valued. Normally, the nonvolatile memory for adjusting the image of the LCD panel has a capacity of several kilobytes, and this memory scale is comparatively small. Therefore, it is especially preferable to employ the semiconductor storage device described in connection with the tenth embodiment as the nonvolatile memory for adjusting the image of the LCD panel.

Twelfth Embodiment

Figure 27:
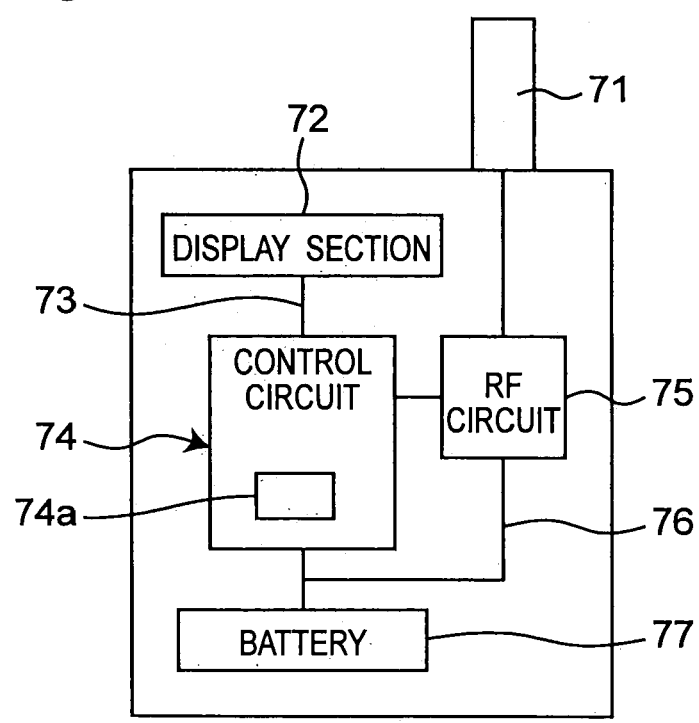
FIG. 27 is a block diagram of a portable telephone as one example of the portable electronic equipment of the twelfth embodiment of the present invention.
Figure 28:
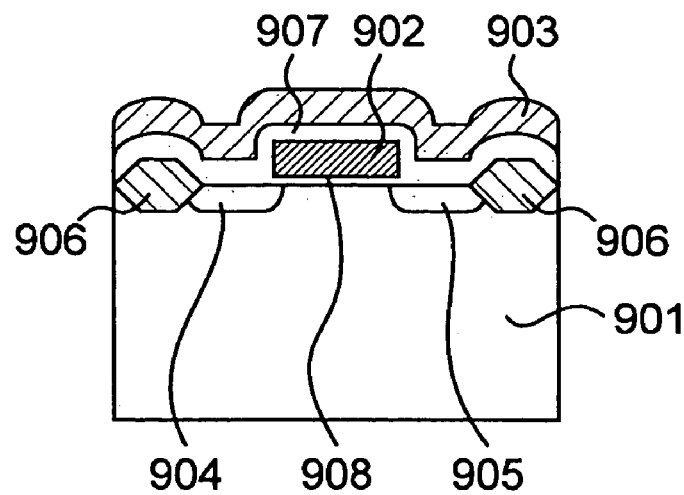
FIG. 28 is a schematic sectional view of the essential part of a conventional flash memory.

FIG. 27 shows a schematic block diagram of a portable telephone as one example of the portable electronic equipment of the twelfth embodiment of the present invention.

As shown in FIG. 27, this portable telephone includes a control circuit 74, a battery 77, an RF (Radio Frequency) circuit 75, a display panel 72, an antenna 71, a signal line 73 and a power line 76. A semiconductor storage device 74a of the first embodiment is incorporated in the control circuit 74. The control circuit 74 should preferably be an integrated circuit where devices of an identical structure are concurrently used as a memory element and a logic circuit element. This facilitates the manufacturing of integrated circuits and allows the manufacturing cost of the portable electronic equipment to be especially reduced.

As described above, by employing the nonvolatile memory 74a, which is able to achieve the storage retention of two bits per memory element and the stable operation, be easy to miniaturize and prevent the circuit malfunction in a portable telephone, there can be provided the portable telephone capable of being downsized, improved in performance and reduced in power consumption.

Moreover, the tenth through twelfth embodiments employ the memory element constructed of the gate electrode formed on the semiconductor layer via the gate insulation film, the channel region arranged under the gate electrode, the diffusion regions that are arranged on both sides of the channel region and have the conductive type opposite to that of the channel region and the memory function bodies that are arranged on both sides of the gate electrode and have the function to retain electric charges, as a memory cell. However, the memory element employed as the memory cell is not limited to this.

Moreover, although there has been described the semiconductor storage device capable of retaining the storage of two bits per memory element in connection with the aforementioned tenth through twelfth embodiments, the present invention may also be applied to a semiconductor storage device capable of retaining the storage of two bits or more per memory element.

Furthermore, in the tenth embodiment, the first and second power voltages VCC1 and VCC2 are confirmed by the power voltage confirmation circuit 44. However, when this semiconductor storage device is supplied with three or more power voltages, the three or more power voltages may be confirmed by the power voltage confirmation circuit.

As is apparent from the above, according to the semiconductor storage device and the control method therefor of the present invention, there can be provided a semiconductor storage device capable of preventing the occurrence of the circuit malfunction attributed to the fact that the level of the power voltage supplied to the memory circuit including the memory cell array is low, retaining the storage of two bits or more per memory element and achieving the stable operation even if the device is miniaturized and reducing the power consumption attributed to the leak current in the standby stage.

Also, the process for fabricating the memory elements is very compatible with the process for fabricating usual transistors. Therefore, in the above semiconductor storage device, the number of masks and the number of processes are remarkably reduced, as compared with the combination of a peripheral circuit comprised of usual transistors and a memory cell array using flash memories as nonvolatile memory elements in the prior art. Accordingly, the yield of chips is improved and the fabricating cost is reduced.

Moreover, when at least part of the memory function bodies possessed by the memory element overlap with part of the diffusion region, it is possible to execute write at a low voltage without necessitating an auxiliary gate or the like.

Furthermore, as another embodiment, if there is provided an insulation film for isolating from the channel region or the semiconductor layer a film that has a surface roughly parallel to the surface of the gate insulation film of the memory element and has a function to retain electric charges, and the insulation film thickness is thinner than the film thickness of the gate insulation film and is not smaller than 0.8 nm, it is easy to inject electric charges into the memory function bodies and allow the voltage of the rewrite operation to be lowered.

As described above, the rewrite of the memory cells constituting the semiconductor storage device of the present invention can be executed at a low voltage. Therefore, if the time from the turning-on of the power through the attainment of the desired voltage to the stabilization of the system is shorter than the time in the conventional case, and by a combination with the circuit of the present invention, there can be achieved higher-speed further-stabilized operation then in the conventional case.

Moreover, in one embodiment, the memory function bodies possessed by the memory element include the film that has the surface roughly parallel to the surface of the gate insulation film and the function to retain electric charges. Generally, when the rewrite operation is executed in a nonvolatile memory, it is verified whether or not the desired operation has been executed, and the rewrite operation is repeated for the one that has caused an operation error until the desired operation is completed. However, conventionally, when a voltage drop has occurred during the repetition of the rewrite operation to cause the lockout of the rewrite command, the operation has been interrupted with the rewrite operation left defective, and this has caused unstable operation of the semiconductor storage device. This problem has become more serious particularly in accordance with the reduction in the voltage of the rewrite operation. According to the aforementioned embodiment, variations in the memory effect are restrained, and the rewrite operation error hardly occurs. Therefore, the frequency of rewrite is reduced, and if there arises the necessity of the rewrite operation, the operation can be completed in an early stage. Therefore, the probability of the entry of a signal that locks out the rewrite command while the rewrite operation is repeated becomes reduced, and this allows a stable semiconductor storage device to be provided.

Moreover, according to the portable electronic equipment of the present invention, by using the semiconductor storage device or the semiconductor storage device control method, there can be provided portable electronic equipment capable of being downsized, improved in performance and reduced in power consumption.

The invention claimed is:

1. A semiconductor storage device comprising:
   a memory cell array employing a memory element as a memory cell wherein the memory element is constructed of a gate electrode formed via a gate insulation film on a semiconductor layer, a channel region arranged under the gate electrode, diffusion regions that are arranged on both sides of the channel region and have a conductive type opposite to that of the channel region and memory function bodies that are formed on both sides of the gate electrode and have a function to retain electric charges; and
   a lockout circuit that inhibits a command to a memory circuit including the memory cell array when a power voltage supplied from outside is lower than a prescribed voltage; wherein
   the power voltage supplied from the outside is comprised of at least a first power voltage supplied to the memory circuit including the memory cell array and a second power voltage supplied to an output circuit, and
   the lockout circuit comprises:
   a voltage detector that outputs a first lockout signal for inhibiting the command to the memory circuit including the memory cell array when the first power voltage is not higher than a first prescribed voltage; and
   a power voltage confirmation circuit that outputs a second lockout signal for inhibiting the command to the memory circuit including the memory cell array when the second power voltage is lower than a second prescribed voltage.

2. The semiconductor storage device as claimed in claim 1, wherein
   the power voltage confirmation circuit outputs a lockout signal for inhibiting the command to the memory circuit including the memory cell array when the first power voltage is lower than the first prescribed voltage.

3. The semiconductor storage device as claimed in claim 1, comprising:
   a comparator that compares the second power voltage with the second prescribed voltage and outputs a signal representing the fact that the second power voltage is higher than the second prescribed voltage to the power voltage confirmation circuit when the second power voltage is higher than the second prescribed voltage.

4. The semiconductor storage device as claimed in claim 3, wherein
a voltage generator circuit for generating the second prescribed voltage is provided, and the supply state of the power voltages of the comparator and the voltage generator circuit are controlled by the second power voltage.

5. The semiconductor storage device as claimed in claim 1, wherein
the voltage detector outputs a signal representing the fact that the first power voltage is lower than the first prescribed voltage to the power voltage confirmation circuit when the first power voltage is lower than the first prescribed voltage.

6. The semiconductor storage device as claimed in claim 1, wherein
the power voltage confirmation circuit confirms the second power voltage upon receiving a signal representing the fact that the command is given to the memory circuit including the memory cell array.

7. The semiconductor storage device as claimed in claim 6, wherein
the power voltage confirmation circuit outputs a signal representing a result of the confirmation of the second power voltage according to the signal representing the fact that the command is given to the memory circuit including the memory cell array.

8. The semiconductor storage device as claimed in claim 1, wherein
the second prescribed voltage is within a range of 0.3 V to 1.2 V.

9. The semiconductor storage device as claimed in claim 1, wherein
the command to the memory circuit including the memory cell array is inhibited when at least one of the first lockout signal from the voltage detector and the second lockout signal from the power voltage confirmation circuit is outputted.

10. The semiconductor storage device as claimed in claim 1, wherein
a supply state of the power voltage of the voltage detector is controlled by the first power voltage.

11. The semiconductor storage device as claimed in claim 1, comprising:
power supply switches that are turned on when the memory circuit including the memory cell array is in an active state to supply the power voltage to at least the memory circuit including the memory cell array and turned off when the memory circuit is in a standby state to stop the supply of the power voltage to at least the memory circuit including the memory cell array.

12. The semiconductor storage device as claimed in claim 11, wherein
the power voltage supplied from the outside is comprised of at least the first power voltage supplied to the memory circuit including the memory cell array and the second power voltage supplied to the output circuit, and
the lockout circuit comprises:
a voltage detector that outputs a first lockout signal for inhibiting the command to the memory circuit including the memory cell array when the first power voltage is not higher than the first prescribed voltage; and
a power voltage confirmation circuit that outputs a second lockout signal for inhibiting the command to the memory circuit including the memory cell array when the second power voltage is lower than the second prescribed voltage.

13. The semiconductor storage device as claimed in claim 1, wherein at least part of the memory function bodies possessed by the memory element overlaps with part of a diffusion region.

14. The semiconductor storage device as claimed in claim 1, wherein there is provided an insulation film for isolating from the channel region or the semiconductor layer a film which has a surface roughly parallel to a surface of the gate insulation film of the memory element and has a function to retain electric charges, and a film thickness of the insulation film is thinner than a film thickness of the gate insulation film and is not smaller than 0.8 nm.

15. The semiconductor storage device as claimed in claim 1, wherein the memory function bodies possessed by the memory element comprise a film that has a surface roughly parallel to a surface of the gate insulation film and has a function to retain electric charges.

16. Portable electronic equipment employing the semiconductor storage device claimed in claim 1.

17. A semiconductor storage device control method for inhibiting a command to a memory circuit including a memory cell array, comprising the steps of:
investigating whether or not the memory circuit is in a standby state;
stopping supply of the power voltage to the memory circuit and inhibiting the command to the memory circuit when the memory circuit is in the standby state;
confirming at least one of the plurality of power voltages by a power voltage confirmation circuit; and
outputting a lockout signal for inhibiting the command from the power voltage confirmation circuit to the memory circuit when any one of the plurality of power voltages is lower than a prescribed voltage; wherein
at least one of the plurality of power voltages is compared with the prescribed voltage by a comparator; and further wherein
supply states of power voltages of the comparator and a voltage generator circuit for generating the prescribed voltage are controlled by a first power voltage supplied to the memory circuit including the memory cell array among the plurality of power voltages.

18. The semiconductor storage device control method as claimed in claim 17, wherein
the command is a rewrite command.

19. The semiconductor storage device control method as claimed in claim 17, wherein
a voltage detector detects whether or not a first power voltage supplied to the memory circuit including the memory cell array among the plurality of power voltages is outside a predetermined range, and
a lockout signal for inhibiting the command to the memory circuit is outputted from the voltage detector when the first power voltage is outside the predetermined range.

20. The semiconductor storage device control method as claimed in claim 19, wherein
the command to the memory circuit including the memory cell array is inhibited when at least one of the lockout signal from the voltage detector and the lockout signal from the power voltage confirmation circuit is outputted.

21. The semiconductor storage device control method as claimed in claim 19, wherein
the supply state of a power voltage of the voltage detector is controlled by the first power voltage.

22. The semiconductor storage device control method as claimed in claim 17, wherein
the lockout signal for inhibiting the command to the memory circuit is outputted from the power voltage confirmation circuit when the power voltage supplied to the output circuit among the plurality of power voltages is lower than the prescribed voltage.

23. The semiconductor storage device control method as claimed in claim 22, wherein
the prescribed voltage for determining the power voltage supplied to the output circuit among the plurality of power voltages is within a range of 0.3 V to 1.2 V.

24. The semiconductor storage device control method as claimed in claim 17, wherein
the plurality of power voltages are confirmed by the power voltage confirmation circuit.

25. The semiconductor storage device control method as claimed in claim 24, wherein
the command to the memory circuit including the memory cell array is inhibited on the basis of at least one of the plurality of power voltages.

26. The semiconductor storage device control method as claimed in claim 24, wherein
the lockout signal for inhibiting the command to the memory circuit is outputted from the power voltage confirmation circuit when the power voltage supplied to the memory circuit including the memory cell array among the plurality of power voltages is outside a predetermined range.

27. Portable electronic equipment control method employing the semiconductor storage device control method claimed in claim 17.

* * * * *